(12) United States Patent
Lee

(10) Patent No.: US 9,899,407 B2
(45) Date of Patent: Feb. 20, 2018

(54) SEMICONDUCTOR DEVICE

(71) Applicant: HunKook Lee, Hwaseong-si (KR)

(72) Inventor: HunKook Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/183,252

(22) Filed: Jun. 15, 2016

(65) Prior Publication Data
US 2017/0040339 A1 Feb. 9, 2017

(30) Foreign Application Priority Data
Aug. 6, 2015 (KR) .................. 10-2015-0111161

(51) Int. Cl.
H01L 27/115 (2017.01)
H01L 27/11582 (2017.01)
H01L 27/11565 (2017.01)
H01L 27/11568 (2017.01)
H01L 27/11573 (2017.01)

(52) U.S. Cl.
CPC .. *H01L 27/11582* (2013.01); *H01L 27/11565* (2013.01); *H01L 27/11568* (2013.01); *H01L 27/11573* (2013.01)

(58) Field of Classification Search
CPC ......... H01L 27/11524; H01L 27/11565; H01L 27/11568; H01L 27/11573; H01L 27/11582
See application file for complete search history.

(56) References Cited

U.S. PATENT DOCUMENTS

| 5,117,277 | A | 5/1992 | Yuyama et al. |
| 6,727,544 | B2 | 4/2004 | Endoh et al. |
| 6,813,756 | B2 | 11/2004 | Igarashi et al. |
| 7,199,426 | B2 | 4/2007 | Ogura et al. |
| 7,957,617 | B2 | 6/2011 | Vollmer et al. |
| 8,189,360 | B2 | 5/2012 | Koyama |
| 8,644,046 | B2 | 2/2014 | Seol et al. |
| 8,729,523 | B2 | 5/2014 | Pio |
| 8,742,586 | B2 | 6/2014 | Mizukami et al. |
| 9,099,349 | B2 | 8/2015 | Kofuji et al. |
| 2011/0199804 | A1* | 8/2011 | Son ................ G11C 5/04 365/51 |
| 2011/0316072 | A1 | 12/2011 | Lee |
| 2014/0063890 | A1* | 3/2014 | Lee ............ H01L 27/11519 365/63 |
| 2014/0162427 | A1 | 6/2014 | Gwak |

(Continued)

FOREIGN PATENT DOCUMENTS

| JP | 2006120719 A | 5/2006 |
| JP | 3822009 B2 | 9/2006 |
| JP | 2011014610 A | 1/2011 |

(Continued)

*Primary Examiner* — Tom Thomas
*Assistant Examiner* — Benjamin Tzu-Hung Liu
(74) *Attorney, Agent, or Firm* — Harness, Dickey & Pierce, P.L.C.

(57) ABSTRACT

A semiconductor device is disclosed. The semiconductor device includes an electrode disposed on a substrate and a plurality of vertical patterns passing through the electrode. The vertical patterns include first vertical patterns arranged to form a rhombus and second vertical patterns arranged to form a non-regular trapezoid or a rhombus.

11 Claims, 36 Drawing Sheets

(56) References Cited

U.S. PATENT DOCUMENTS

2014/0346682 A1   11/2014   Lee et al.
2016/0284717 A1*   9/2016   Wolstenholme .... H01L 27/0207

FOREIGN PATENT DOCUMENTS

| KR | 100483035 B1 | 4/2005 |
| KR | 20110140018 A | 12/2011 |
| KR | 20140073165 A | 6/2014 |
| KR | 20140137632 A | 12/2014 |

* cited by examiner

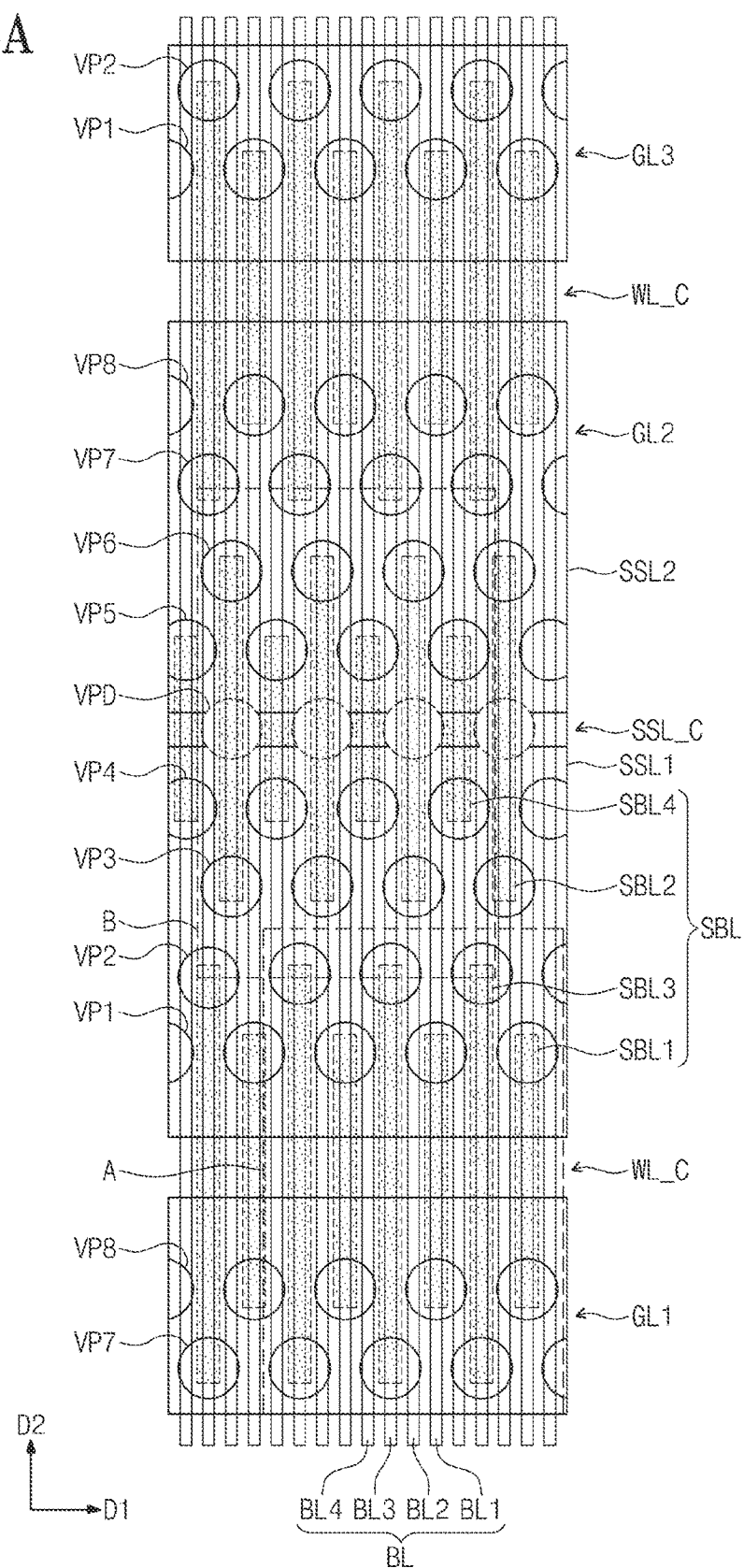

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2015-0111161, filed on Aug. 6, 2015, in the Korean Intellectual Property Office, the entire contents of which are hereby incorporated by reference.

BACKGROUND

Example embodiments of inventive concepts relate to a semiconductor device, and in particular, to a semiconductor memory device.

Higher integration of semiconductor devices is desired to satisfy consumer demands for superior performance and inexpensive prices. In the case of semiconductor memory devices, their integration is an important factor in determining product prices. In the case of typical two-dimensional semiconductor memory devices, since their integration is mainly determined by the area occupied by a unit memory cell, integration is greatly influenced by the level of a fine pattern forming technology. However, the extremely expensive process equipment is used to increase pattern fineness sets a practical limitation on increasing integration for two-dimensional semiconductor memory devices.

SUMMARY

Example embodiments of inventive concepts provide a semiconductor device with a high integration density and a high operation speed.

According to example embodiments of inventive concepts, a semiconductor device may include a substrate, an electrode structure on the substrate, the electrode structure including electrodes stacked on the substrate and extending parallel to a first direction, and a plurality of vertical patterns passing through the electrode structure. The vertical patterns may include first vertical patterns arranged in the first direction, second vertical patterns arranged in the first direction, and third patterns arranged in the first direction. The second vertical patterns are adjacent to the first vertical patterns and spaced apart from the first vertical patterns in a second direction crossing the first direction. The third vertical patterns are adjacent to the second vertical patterns and spaced apart from the second vertical patterns in the second direction. The first and second vertical patterns may be arranged so centers of three most adjacent vertical patterns among the first and second vertical patterns are positioned at vertices of a regular triangle, and the second and third vertical patterns may be arranged so centers of three most adjacent vertical patterns among the second and third vertical patterns are positioned at vertices of a scalene triangle.

In example embodiments, a distance of the second vertical patterns shifted from the first vertical patterns in the first direction may be different from a distance of the third vertical patterns shifted from the second vertical patterns in the first direction.

In example embodiments, the vertical patterns may further include fourth vertical patterns arranged in the first direction. The fourth vertical patterns may be adjacent to the third vertical patterns. The fourth vertical patterns may be spaced apart from the third vertical patterns in the second direction. The third and fourth vertical patterns may be arranged so centers of three most adjacent vertical patterns among the third and fourth vertical patterns are positioned at vertices of a second regular triangle.

In example embodiments, the vertical patterns may further include dummy vertical patterns arranged in the first direction, adjacent to the fourth vertical patterns, and spaced apart from the fourth vertical patterns in the second direction. The fourth and dummy vertical patterns may be arranged so centers of three most adjacent vertical patterns among the four the vertical patterns and the dummy vertical patterns are positioned at vertices of a third regular triangle.

In example embodiments, the vertical patterns may further include fifth vertical patterns, sixth vertical patterns, seventh vertical patterns, and eighth vertical patterns that may be symmetrically arranged about the dummy vertical patterns with respect to the first vertical patterns, second vertical patterns, third vertical patterns, and fourth vertical patterns, respectively.

In example embodiments, the semiconductor device may further include first subsidiary lines connecting the third vertical patterns to the sixth vertical patterns, respectively, and second subsidiary lines connecting the fourth vertical patterns to the fifth vertical patterns, respectively. The first subsidiary lines and the second subsidiary lines may include a bar-shaped structure extending in the second direction. The first subsidiary lines may overlap the dummy vertical patterns, respectively, when viewed in a plan view. The first and second subsidiary lines may be alternatingly arranged in the first direction.

In example embodiments, the semiconductor device may further include an additional electrode structure spaced apart from the electrode structure in a direction opposite to the second direction, and third subsidiary lines. The additional electrode structure may include substantially the same configuration as the electrode structure, and the third subsidiary lines may connect the eighth vertical patterns of the additional electrode structure to the first vertical patterns of the electrode structure, respectively. The third subsidiary lines may include a bar-shaped structure extending in the second direction. The semiconductor device may further include fourth subsidiary lines connecting seventh vertical patterns of the additional electrode structure to the second vertical patterns of the electrode structure, respectively, and the fourth subsidiary lines may include a bar-shaped structure extending in the second direction. The semiconductor device may further include first, second, third, and fourth bit lines, that are connected to the first, second, third, and fourth subsidiary lines, respectively, and extend in the second direction. The first, second, third, and fourth bit lines may extend in the second direction.

According to example embodiments of inventive concepts, a semiconductor device may include a substrate, an electrode structure on the substrate, and a plurality of vertical patterns passing through the electrode structure. The electrode structure extends in a first direction. The electrode structure includes a ground selection electrode, a string selection electrode, and cell electrodes sequentially stacked between the ground and string selection electrodes. The vertical patterns may include first vertical patterns and second vertical patterns. The first vertical patterns may be arranged to have centers positioned at vertices of at least one regular triangle, and the second vertical patterns may be arranged to have centers positioned at vertices of at least one scalene triangle.

In example embodiments, distances between the centers of the first vertical patterns may be the same, and at least one of distances between the centers of the second vertical patterns may be different than the distances between the centers of the first vertical patterns.

According to example embodiments of inventive concepts, a semiconductor device may include a substrate, an electrode structure on the substrate, and vertical patterns arranged in rows on the substrate. The vertical patterns extend through the electrode structure in a direction perpendicular to a top surface of the substrate. The vertical patterns in a same one of the rows are spaced apart from each other in a first direction. The vertical patterns include first vertical patterns in a first row, second vertical patterns in a second row, and third vertical patterns in a third row. The first to third rows of vertical patterns are arranged sequentially in a second direction from a same edge of the electrode structure such that the first to third vertical patterns all extend through a first half of the electrode structure along the second direction in a plan view. Each center of two adjacent first vertical patterns is spaced apart from a center of an adjacent second vertical pattern by a diagonal distance that is the same as a distance in the first direction that the centers of the two adjacent first vertical patterns are spaced apart from each other. The vertical patterns include a dummy row of vertical patterns extending through the electrode structure. The third vertical patterns are spaced apart in the second direction from corresponding dummy vertical patterns in the dummy row of vertical patterns.

In example embodiments, the vertical patterns may further include fourth vertical patterns in a fourth row, fifth vertical patterns in a fifth row, sixth vertical patterns in a sixth row, seventh vertical patterns in a seventh row, and eighth vertical patterns in an eighth row. The fourth row of vertical patterns may between the dummy row of vertical patterns and the third row of vertical patterns. The fifth to eighth rows of vertical patterns may be arranged sequentially in the second direction from the dummy row of vertical patterns such that the fifth to eighth rows of vertical patterns all extend through a second half of the electrode structure along the second direction in the plan view.

In example embodiments, the fifth vertical patterns, sixth vertical patterns, seventh vertical patterns, and eighth vertical patterns may be symmetrically arranged about the dummy vertical patterns with respect to the first vertical patterns, second vertical patterns, third vertical patterns, and fourth vertical patterns, respectively. Each center of two adjacent third vertical patterns may be spaced apart from a center of a nearby second vertical pattern by a diagonal distance that is different than a distance in the first direction that the centers of the two adjacent third vertical patterns are spaced apart from each other.

In example embodiments, the fifth vertical patterns, sixth vertical patterns, seventh vertical patterns, and eighth vertical patterns may be symmetrically arranged about the dummy vertical patterns with respect to the first vertical patterns, second vertical patterns, third vertical patterns, and fourth vertical patterns, respectively. Each center of two adjacent third vertical patterns may be spaced apart from a center of a nearby second vertical pattern by a diagonal distance that is equal to a distance in the first direction that the centers of the two adjacent third vertical patterns are spaced apart from each other.

In example embodiments, the semiconductor device may further include another electrode structure spaced apart from the electrode structure in the second direction, and subsidiary lines. The electrode structure may be a first electrode structure and the other electrode structure may be a second electrode structure. The vertical patterns may include additional vertical patterns that may extend through the second electrode structure with the same arrangement as the vertical patterns that extend through the first electrode structure such that the vertical patterns may include first to eighth vertical patterns and dummy vertical patterns extending through the second electrode structure. The subsidiary lines may include first subsidiary lines, second subsidiary lines, third subsidiary lines, and fourth subsidiary lines. The first subsidiary lines may each connect one of the first vertical patterns extending through the first electrode to a corresponding one of the eighth vertical patterns extending through the second electrode and spaced apart in the second direction. The second subsidiary lines may each connect one of the second vertical patterns extending through the first electrode to a corresponding one of the seventh vertical patterns extending through the second electrode and spaced apart in the second direction. The third subsidiary lines may connect the third vertical patterns extending through the first electrode to corresponding sixth vertical patterns extending through the first electrode and spaced apart in the second direction. The fourth subsidiary lines may connect the fourth vertical patterns extending through the first electrode to corresponding fifth vertical patterns extending through the first electrode and spaced apart in the second direction. The third and fourth subsidiary lines may cross over the dummy vertical patterns.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A and 4B are plan views illustrating a semiconductor device according to example embodiments of inventive concepts.

FIGS. 7A through 11A are plan views corresponding to FIG. 5A.

FIGS. 7B through 11B are plan views corresponding to FIG. 5B.

FIGS. 7C through 11C are sectional views taken along line I-I' of FIG. 7A.

FIGS. 7D through 11D are sectional views taken along line II-II' of FIG. 7B.

Figure 1:
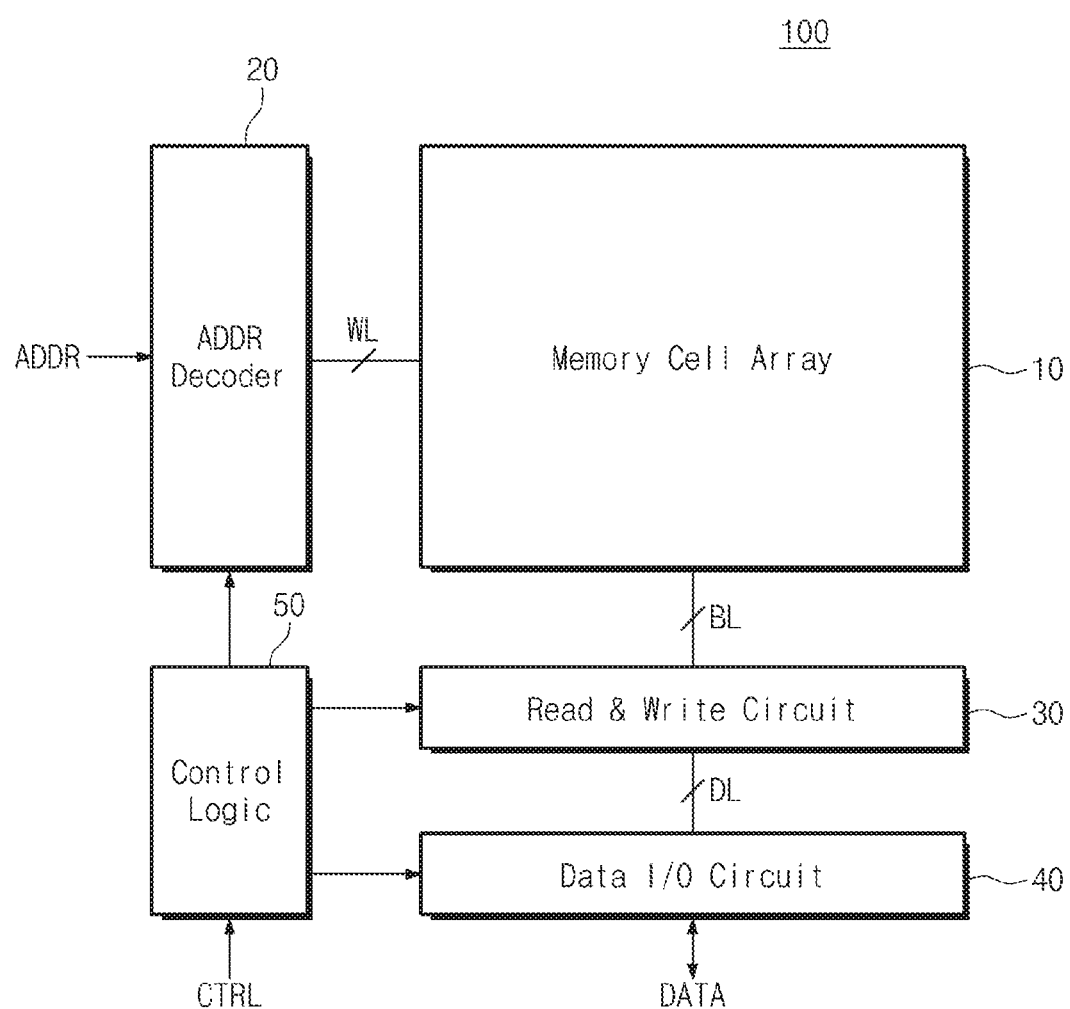
FIG. 1 is a block diagram illustrating a semiconductor device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiments, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

FIG. 1 is a block diagram illustrating a semiconductor device 100 according to example embodiments of inventive concepts. Referring to FIG. 1, a semiconductor device according to example embodiments of inventive concepts may include a memory cell array 10, an address decoder 20, a read/write circuit 30, a data input/output circuit 40, and a control logic 50.

The memory cell array 10 may be connected to the address decoder 20 via a plurality of word lines WL and may be connected to the read/write circuit 30 via a plurality of bit lines BL. The memory cell array 10 may include a plurality of memory cells. For example, the memory cell array 10 may be configured to store one or more bits in each cell.

The address decoder 20 may be connected to the memory cell array 10 via the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder, and address buffer.

The read/write circuit 30 may be connected to the memory cell array 10 via the bit line BL, and may be connected to the data input/output circuit 40 via the data lines DL. The read/write circuit 30 may operate according to the control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. As another example, the read/write circuit 30 may include elements which include a sensing amplifier, a write driver and a column selection circuit.

The data input/output circuit 40 may be connected to the read/write circuit 30 via the data lines DL. The data input/output circuit 40 operates according to the control of the control logic 50. The data input/output circuit 40 exchanges data DATA with the outside. The data input/output circuit 40 transfers the data DATA to the read/write circuit 30 via the data lines DL. The data input/output circuit 40 outputs the data DATA, which is transferred from the read/write circuit 30 through the data lines DL, to the outside. For example, the data input/output circuit 40 may include an element such as a data buffer.

The control logic 50 may be connected to the address decoder 20, the read/write circuit 30 and the data input/output circuit 40. The control logic 50 may be configured to control the operation of a 3D semiconductor device. The control logic 50 may operate in response to a control signal CTRL transferred from the outside.

Figure 2:
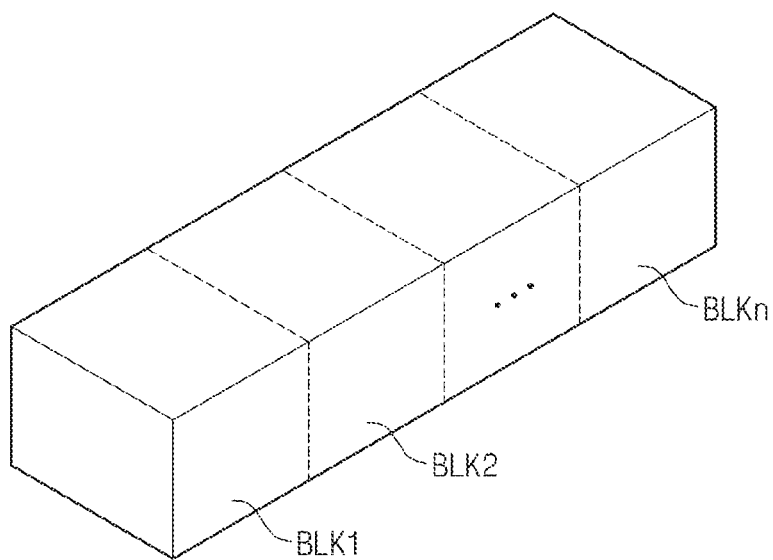
FIG. 2 is a block diagram illustrating an example of the memory cell array of FIG. 1.

FIG. 2 is a block diagram illustrating an example of the memory cell array 10 of FIG. 1. Referring to FIG. 2, the memory cell array 10 may include a plurality of memory blocks BLK1-BLKn. Each of the memory blocks BLK1 to BLKn may have a three-dimensional (3D) structure or a vertical structure.

Figure 3:
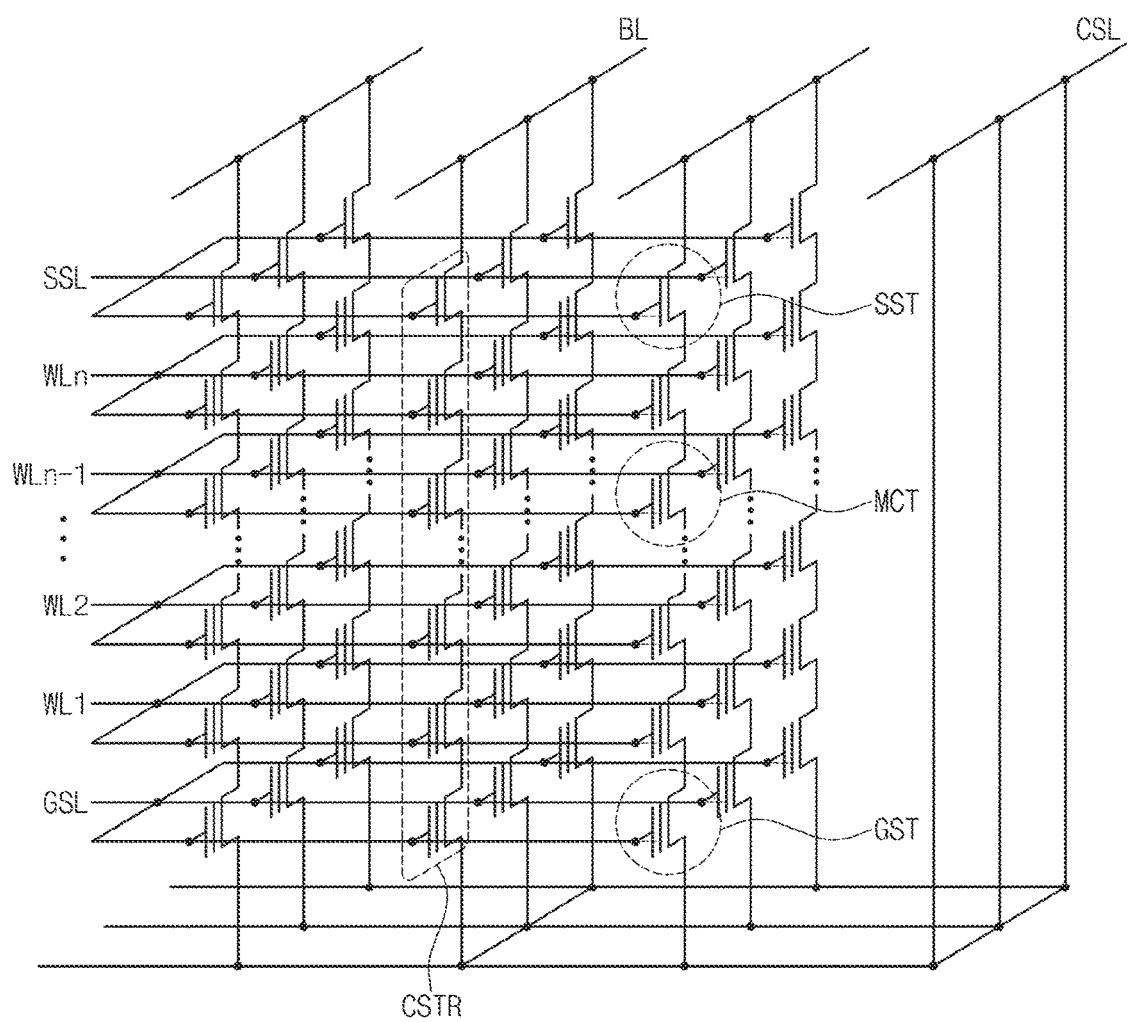
FIG. 3 is a circuit diagram illustrating a semiconductor device according to example embodiments of inventive concepts.

FIG. 3 is a circuit diagram illustrating the semiconductor device described with reference to FIGS. 1 and 2. Referring to FIGS. 1 through 3, the semiconductor device according to example embodiments of inventive concepts may include a common source line CSL, bit lines BL, and a plurality of cell strings CSTR disposed between the common source line CSL and the bit lines BL. Some of the cell strings CSTR may be connected in parallel to a same bit line BL among the bit lines BL.

Each of the cell strings CSTR may include a ground selection transistor GST coupled to the common source line CSL, a string selection transistor SST coupled to a corresponding one of the bit lines BL, and a plurality of memory cell transistors MCT interposed between the ground and string selection transistors GST and SST. The ground selection transistor GST, the memory cell transistors MCT, and the string selection transistor SST may be connected in series between the common source line CSL and the bit line BL. Each of the cell strings CSTR may further include a ground selection line GSL, a plurality of word lines WL1-WLn, and a string selection line SSL, which are respectively used as gate electrodes of the ground selection transistor GST, the memory cell transistors MCT, and the string selection transistor SST.

Figure 4B:
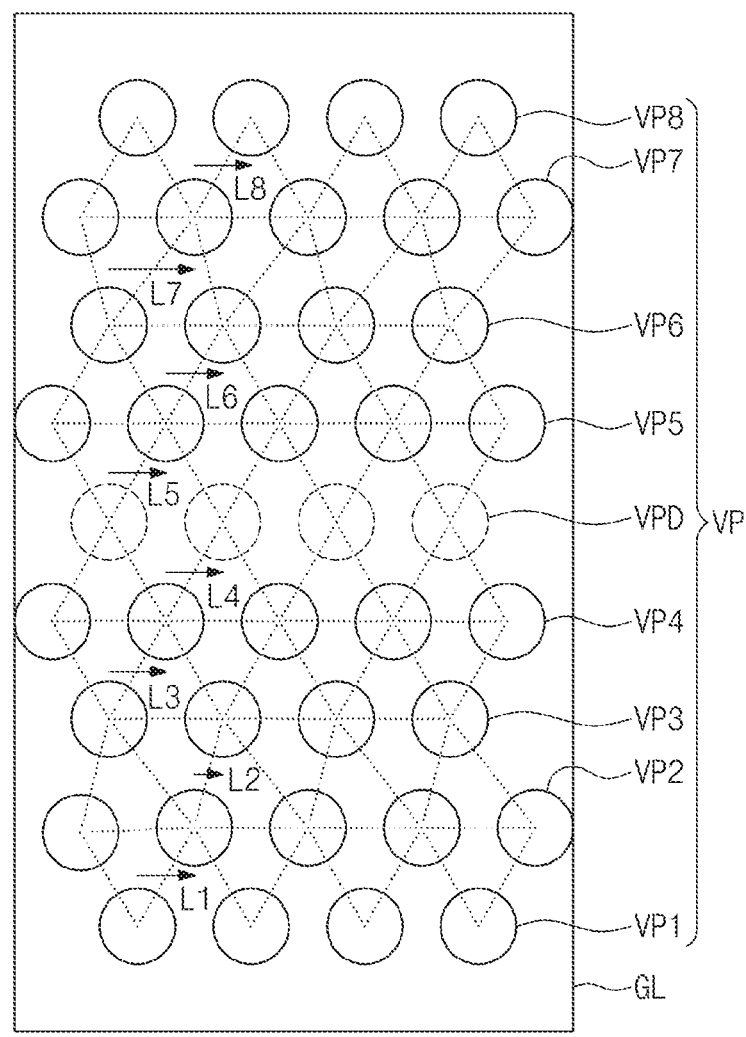

FIGS. 4A and 4B are plan views illustrating a semiconductor device according to example embodiments of inventive concepts. In particular, FIG. 4B illustrates an example of planar arrangement of vertical patterns provided in the semiconductor device.

Referring to FIGS. 4A and 4B, electrode structures GL may extend in a first direction D1. The electrode structures GL may be provided to face each other in a second direction D2 crossing the first direction D1. The electrode structures GL may include first, second, and third gate electrode structures GL1, GL2, and GL3, as partially shown in FIG. 4A. The first to third electrode structures GL1, GL2, and GL3 may be sequentially arranged in the second direction D2. A first isolation region WL_C extending parallel to the first direction D1 may be provided between the electrode structures GL.

A plurality of vertical patterns VP may be provided in the first and second directions D1 and D2 to form a zigzag arrangement, when viewed in a plan view. The vertical patterns VP may be coupled to the electrode structures GL extending in the first direction D1. The vertical patterns VP may be provided to pass through the electrode structures GL. The vertical patterns VP may be connected to the bit lines BL extending in the second direction D2.

The vertical patterns VP may include groups of first to eighth vertical patterns VP1-VP8. Each group of the first to eighth vertical patterns VP1-VP8 may be disposed to form a column parallel to the first direction D1. The first to eighth vertical patterns VP1-VP8 may be spaced apart from each other in the second direction D2. For example, the second vertical patterns VP2 may be disposed adjacent to and spaced apart from the first vertical patterns VP1 in the second direction D2. The third vertical patterns VP3 may be disposed adjacent to and spaced apart from the second vertical patterns VP2 in the second direction D2. The fourth vertical patterns VP4 may be disposed adjacent to and spaced apart from the third vertical patterns VP3 in the second direction D2. The fifth vertical patterns VP5 may be disposed adjacent to and spaced apart from the fourth vertical patterns VP4 in the second direction D2. The sixth vertical patterns VP6 may be disposed adjacent to and spaced apart from the fifth vertical patterns VP5 in the second direction D2. The seventh vertical patterns VP7 may be disposed adjacent to and spaced apart from the sixth vertical patterns VP6 in the second direction D2. The eighth vertical patterns VP8 may be disposed adjacent to the seventh vertical patterns VP7 and may be spaced apart from the first vertical patterns VP1 in the second direction D2. In example embodiments, dummy vertical patterns VPD may be further provided between the fourth vertical patterns VP4 and the fifth vertical patterns VP5 and may be arranged in the first direction D1. The first and eighth vertical patterns VP1 and VP8 may be positioned relatively adjacent to edges of each of the electrode structures GL or adjacent to a first isolation region WL_C, when compared with the others of the vertical patterns VP.

The second vertical patterns VP2 may be shifted from the first vertical patterns VP1 by a first distance L1 in the first direction D1. The third vertical patterns VP3 may be shifted from the second vertical patterns VP2 by a second distance L2 in the first direction D1. The fourth vertical patterns VP4 may be shifted from the third vertical patterns VP3 by a third distance L3 in the first direction D1. The dummy vertical patterns VPD may be shifted from the fourth vertical patterns VP4 by a fourth distance L4 in the first direction D1. The fifth vertical patterns VP5 may be shifted from the dummy vertical patterns VPD by a fifth distance L5 in the first direction D1. The sixth vertical patterns VP6 may be shifted from the fifth vertical patterns VP5 by a sixth distance L6 in the first direction D1. The seventh vertical patterns VP7 may be shifted from the sixth vertical patterns VP6 by a seventh distance L7 in the first direction D1. The eighth vertical patterns VP8 may be shifted from the seventh vertical patterns VP7 by an eighth distance L8 in the first direction D1. In example embodiments, the first, third, fourth, fifth, sixth, and eighth distances L1, L3, L4, L5, L6, and L8 may be the same (and/or substantially the same), and the second and seventh distances L2 and L7 may be different from each other. For example, the seventh distance L7 may be longer than the second distance L2.

Accordingly, the first and second vertical patterns VP1 and VP2 may be disposed in such a way that centers of three most adjacent ones thereof are located at vertices of a regular triangle. Similarly, the third and fourth vertical patterns VP3 and VP4 may be disposed in such a way that centers of three most adjacent ones thereof are located at vertices of a regular triangle. The fourth and dummy vertical patterns VP4 and VPD may be disposed in such a way that centers of three most adjacent ones thereof are located at vertices of a regular triangle. The dummy and fifth vertical patterns VPD and VP5 may be disposed in such a way that centers of three most adjacent ones thereof are located at vertices of a regular triangle. The fifth and sixth vertical patterns VP5 and VP6 may be disposed in such a way that centers of three most adjacent ones thereof are located at vertices of a regular triangle. The seventh and eighth vertical patterns VP7 and VP8 may be disposed in such a way that centers of three most adjacent ones thereof are located at vertices of a regular triangle. In other words, the first and second vertical patterns VP1 and VP2 may be disposed to allow three most adjacent ones thereof to have substantially the same center-to-center distance (hereinafter, a first distance). The third and fourth vertical patterns VP3 and VP4 may be disposed to allow three most adjacent ones thereof to have substantially the same center-to-center distance (e.g., the first distance). The fourth and dummy vertical patterns VP4 and VPD may be disposed to allow three most adjacent ones thereof to have substantially the same center-to-center distance (e.g., the first distance). The dummy and fifth vertical patterns VPD and VP5 may be disposed to allow three most adjacent ones thereof to have substantially the same center-to-center distance (e.g., the first distance). The fifth and sixth vertical patterns VP5 and VP6 may be disposed to allow three most adjacent ones thereof to have substantially the same center-to-center distance (e.g., the first distance). The seventh and eighth vertical patterns VP7 and VP8 may be disposed to allow three most adjacent ones thereof to have substantially the same center-to-center distance (e.g., the first distance).

By contrast, the second and third vertical patterns VP2 and VP3 may be disposed in such a way that centers of three most adjacent ones thereof are located at vertices of a scalene triangle. Similarly, the sixth and seventh vertical patterns VP6 and VP7 may be disposed in such a way that centers of three most adjacent ones thereof are located at vertices of a scalene triangle. For example, the second and third vertical patterns VP2 and VP3 may be disposed to allow at least one pair of three most adjacent ones thereof to have a center-to-center distance smaller or greater than the first distance. The sixth and seventh vertical patterns VP6 and VP7 may be disposed to allow at least one pair of three most adjacent ones thereof to have a center-to-center distance smaller or greater than the first distance.

In other words, the third, fourth, and dummy vertical patterns VP3, VP4, and VPD may be disposed in such a way that centers of four adjacent ones thereof are located at vertices of a rhombus. Similarly, the dummy, fifth, and sixth vertical patterns VPD, VP5, and VP6 may be disposed in such a way that centers of four adjacent ones thereof are located at vertices of a rhombus. By contrast, the first, second, and third vertical patterns VP1, VP2, and VP3 may be disposed in such a way that centers of four adjacent ones thereof are located at vertices of a non-regular trapezoid, an isosceles trapezoid, or a kite. Similarly, the second, third, and fourth vertical patterns VP2, VP3, and VP4 may be disposed in such a way that centers of four adjacent ones thereof are located at vertices of a non-regular trapezoid, an isosceles trapezoid, or a kite. The fifth, sixth, and seventh vertical patterns VP5, VP6, and VP7 may be disposed in such a way that centers of four adjacent ones thereof are located at vertices of a non-regular trapezoid, a isosceles trapezoid, or a kite. The sixth, seventh, and eighth vertical patterns VP6, VP7, and VP8 may be disposed in such a way that centers of four adjacent ones thereof are located at vertices of a non-regular trapezoid, an isosceles trapezoid, or a kite. Subsidiary lines SBL may be provided between the vertical patterns VP and the bit lines BL. The bit lines BL may be connected to the vertical patterns VP through the subsidiary lines SBL. The subsidiary lines SBL may include first to fourth subsidiary lines SBL1-SBL4.

Figure 5A:
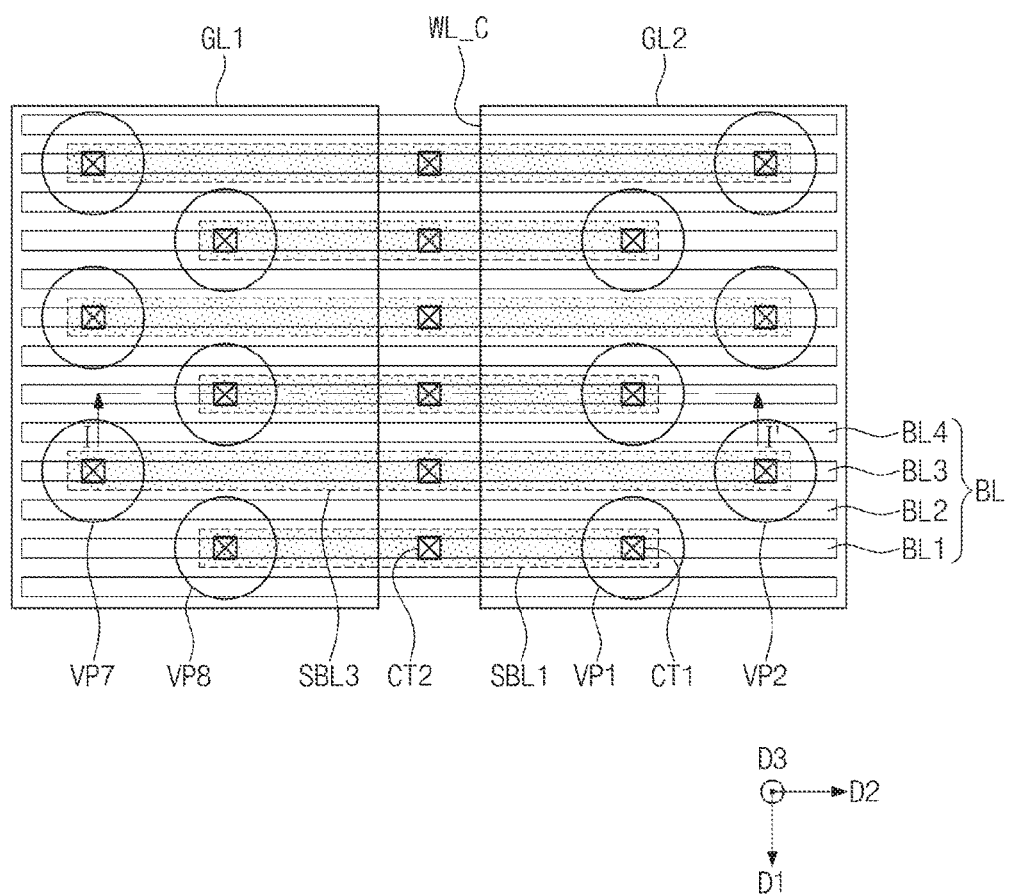
FIG. 5A is an enlarged view of a portion 'A' of FIG. 4A.
Figure 5B:
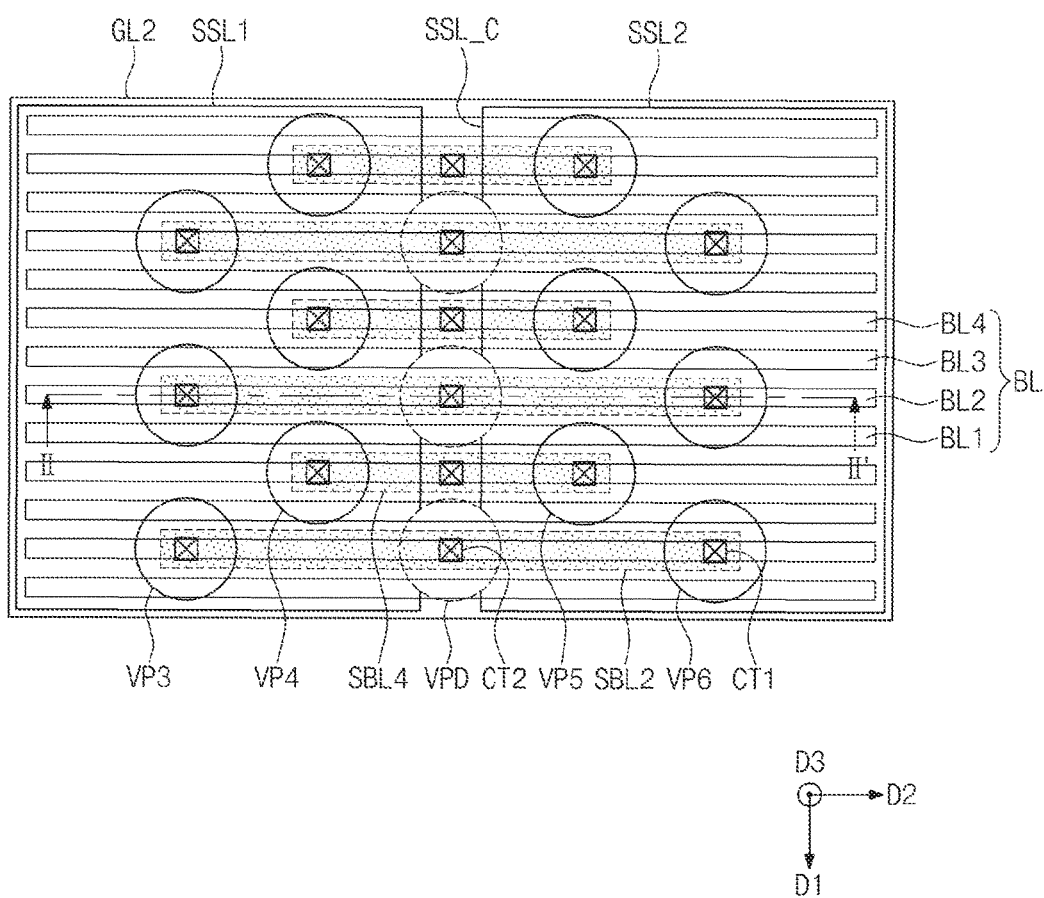
FIG. 5B is an enlarged view of a portion 'B' of FIG. 4A.
Figure 5C:
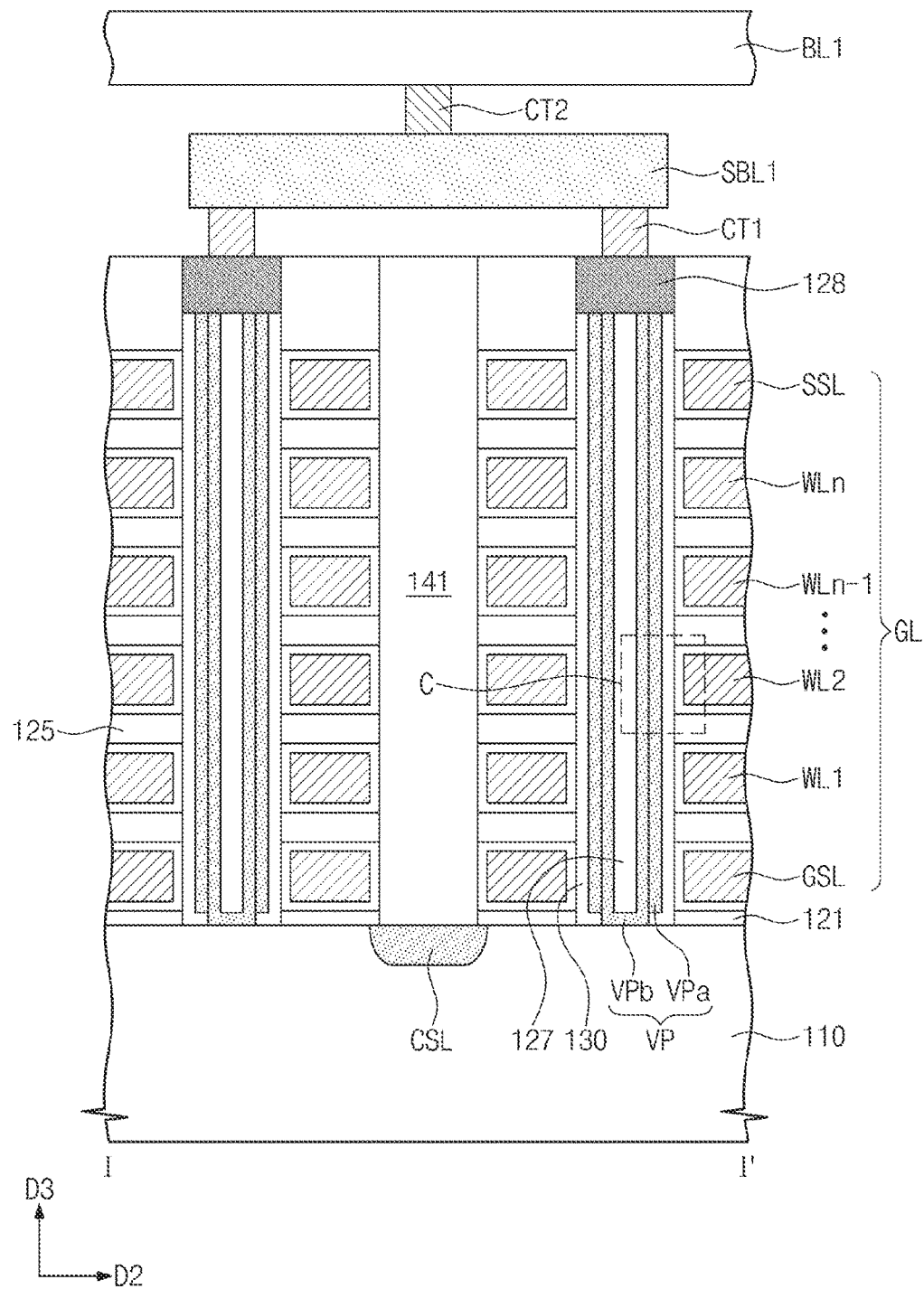
FIG. 5C is a sectional view taken along line I-I' of FIG. 5A.
Figure 5D:
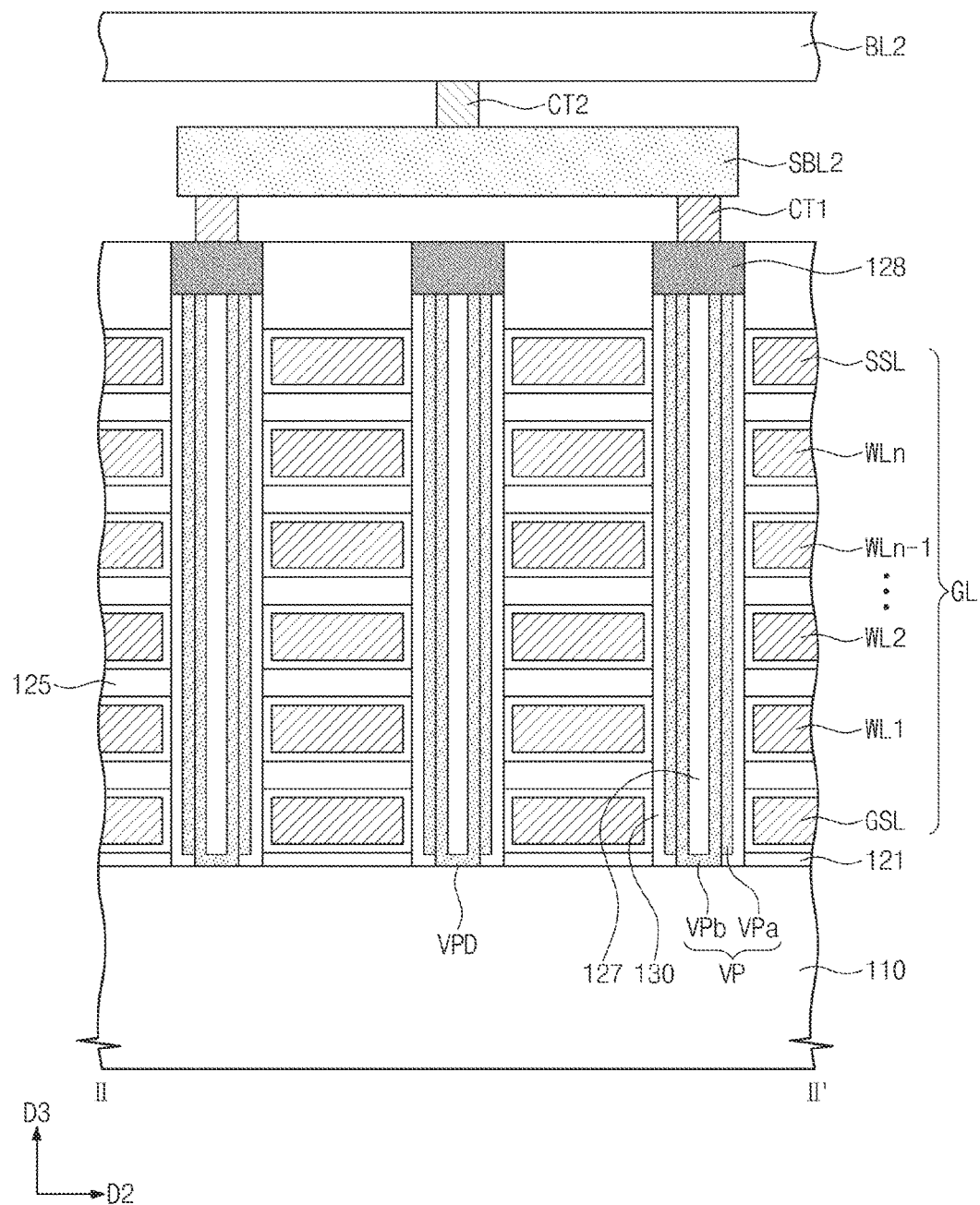
FIG. 5D is a sectional view taken along line II-II' of FIG. 5B.

FIG. 5A is an enlarged view of a portion 'A' of FIG. 4A, and FIG. 5B is an enlarged view of a portion 'B' of FIG. 4A. FIG. 5C is a sectional view taken along line I-I' of FIG. 5A. FIG. 5D is a sectional view taken along line II-II' of FIG. 5B.

Referring to FIGS. 4A and 5A through 5D, the second subsidiary lines SBL2 may be provided to connect the third and sixth vertical patterns VP3 and VP6 that are coupled to the same one of the electrode structures GL and may have a bar-shaped structure extending in the second direction D2. The fourth subsidiary lines SBL4 may be provided to connect the fourth and fifth vertical patterns VP4 and VP5 that are coupled to the same one of the electrode structures GL and may have a bar-shaped structure extending in the second direction D2. The second subsidiary lines SBL2 may be respectively overlapped with the dummy vertical patterns VPD, when viewed in a plan view. The second and fourth subsidiary lines SBL2 and SBL4 may be alternatingly disposed in the first direction D1.

The first and third subsidiary lines SBL1 and SBL3 may be provided to connect the vertical patterns that are respectively coupled to adjacent ones of the electrode structures. For example, the first subsidiary lines SBL1 may be provided to connect the eighth vertical patterns VP8 of the first electrode structure GL1 to the first vertical patterns VP1 of the second electrode structure GL2 and may have a bar-shaped structure extending in the second direction D2. The third subsidiary lines SBL3 may be provided to connect the seventh vertical patterns VP7 of the first electrode structure GL1 to the second vertical patterns VP2 of the second electrode structure GL2 and may have a bar-shaped structure extending in the second direction D2. The first and third subsidiary lines SBL1 and SBL3 may be alternatingly disposed in the first direction D1.

The first to fourth bit lines BL1, BL2, BL3, and BL4 may be disposed on the subsidiary lines and may be connected to the first to fourth subsidiary lines SBL1, SBL2, SBL3, and SBL4, respectively. The first to fourth bit lines BL1, BL2, BL3, and BL4 may extend in the second direction D2.

The subsidiary lines SBL1-SBL4 may be connected to the vertical patterns VP1-VP8 through first contacts CT1. The first contact CT1 may be disposed on the vertical pattern VP1-VP8, respectively. The subsidiary lines SBL1-SBL4 may not be provided on the dummy vertical patterns VPD. The bit lines BL1-BL4 may be connected to the subsidiary lines SBL1-SBL4, respectively, through second contacts CT2. The second contact CT2 connected to the second subsidiary line SBL2 may be disposed on the dummy vertical patterns VPD. The second contacts CT2 connected to the first and third subsidiary lines SBL1 and SBL3 may be disposed on a first isolation region WL_C.

Referring back to FIGS. 5C and 5D, a substrate 110 may be provided. The substrate 110 may include at least one selected from the group consisting of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer. The substrate 110 may have a first conductivity type (e.g., p-type). The electrode structures GL may be provided on the substrate 110. A buffer dielectric layer 121 may be provided between the substrate 110 and the electrode structures GL. The buffer dielectric layer 121 may be a silicon oxide layer.

Each of the electrode structures GL may include insulating patterns 125 and gate electrodes. The gate electrodes may be spaced apart from each other by the insulating patterns 125 interposed therebetween and may include a ground selection electrode GSL, a string selection electrode SSL, and cell electrodes WL1-WLn, which are sequentially stacked between the ground and string selection electrodes GSL and SSL. The insulating patterns 125 may be a silicon oxide layer. The buffer dielectric layer 121 may be thinner than the insulating patterns 125. The gate electrodes GSL, WL1-WLn, and SSL may be formed of or include at least one of doped silicon, metals (e.g., tungsten), metal nitrides, or metal silicides.

The electrode structures GL may be spaced apart from each other by the first isolation region WL_C in the second direction D2. A first isolation insulating layer 141 may be provided to fill the first isolation region WL_C. The string selection electrode SSL may include first and second string selection electrodes SSL1 and SSL2 which are separated from each other in the second direction D2 by a second isolation region SSL_C. The first and second string selection electrodes SSL1 and SSL2 may be adjacent to each other and may be alternatingly disposed in the second direction D2. The dummy vertical patterns VPD may be arranged along the second isolation region SSL_C. The first to fourth vertical patterns VP1, VP2, VP3, and VP4 may be coupled to the first string selection electrode SSL1, and the fifth to eighth vertical patterns VP5, VP6, VP7, and VP8 may be coupled to the second string selection electrode SSL2.

The vertical patterns VP may be provided in vertical holes VH penetrating the electrode structures GL and may be connected to the substrate 110. Each of the vertical patterns VP may have a longitudinal axis parallel to an upward or third direction D3 that is normal to a top surface of the substrate 110. Each of the vertical patterns VP may include opposite ends that are respectively connected to the substrate 110 and a corresponding one of the bit lines BL.

In example embodiments, the vertical patterns VP may be formed of or include a semiconductor layer (e.g., a silicon layer of a first conductivity type). Each of the vertical patterns VP may include a first semiconductor layer VPa in contact with the substrate 110 and a second semiconductor layer VPb on the first semiconductor layer VPa. The vertical patterns VP may serve as active regions of transistors. The vertical patterns VP may be solid-cylindrical pillars or hollow-cylindrical (e.g., macaroni-type) pillars. In the case where the vertical pattern VP is shaped like the macaroni, an insulating gap-fill layer 127 may be provided to fill an inner space of the vertical pattern VP. The insulating gap-fill layer 127 may be formed of or include a silicon oxide layer. Conductive patterns 128 may be provided on the vertical patterns VP, respectively. Portions of the vertical patterns VP in contact with the conductive patterns 128 may serve as drain regions (e.g., of the MOS-type transistors or the cell strings).

In example embodiments, the vertical patterns VP may include at least one of conductive materials, for example, doped semiconductors, metals, conductive metal nitrides, silicides, or nanostructures (such as carbon nanotube or graphene).

Figure 6:
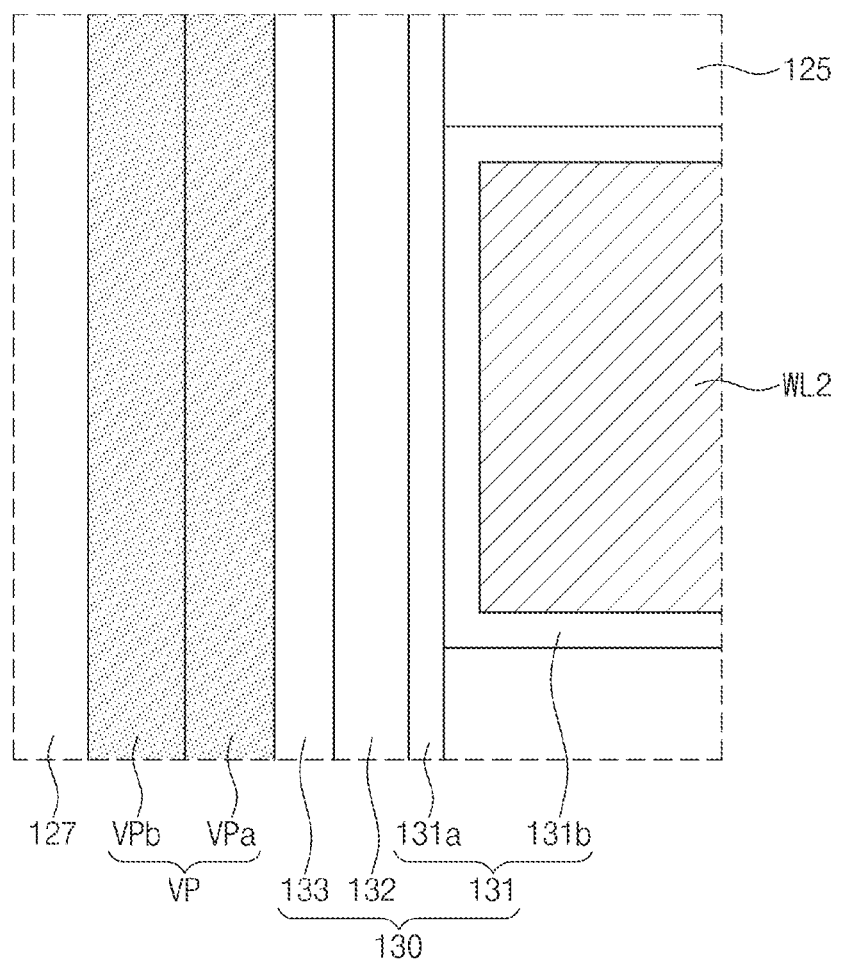
FIG. 6 is an enlarged view of a portion 'C' of FIG. 5A.
Figure 7A:
Figure 7A:
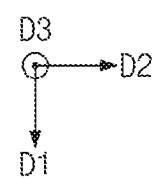
Figure 7B:
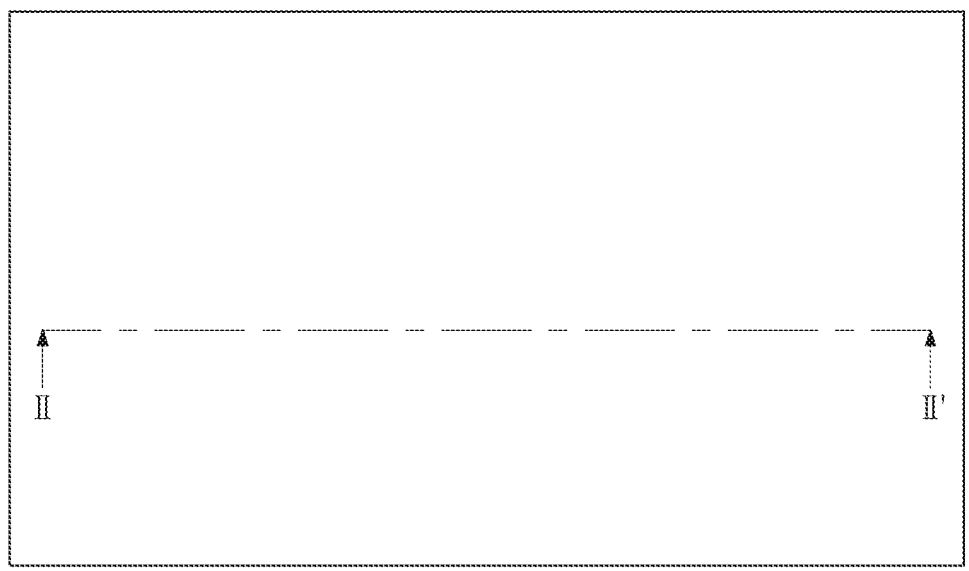
Figure 7B:
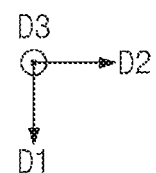
Figure 7C:
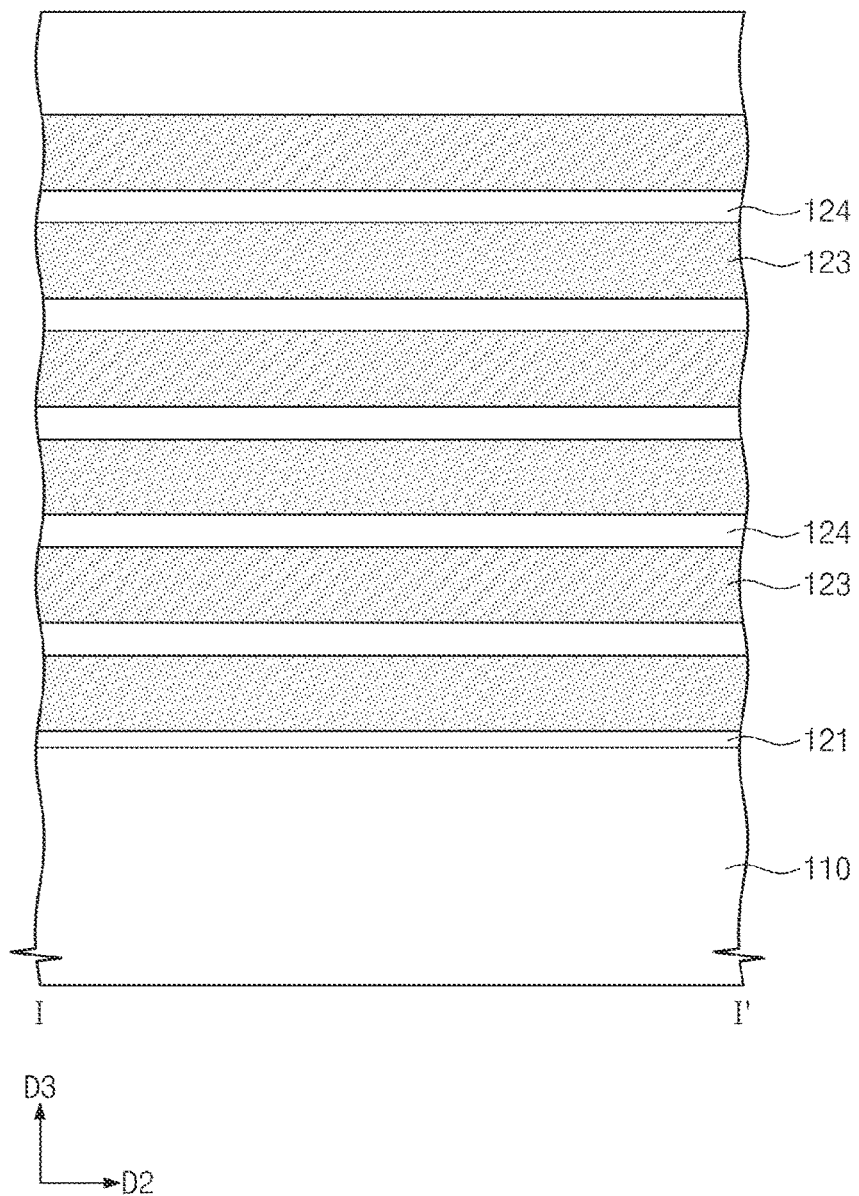
Figure 7D:
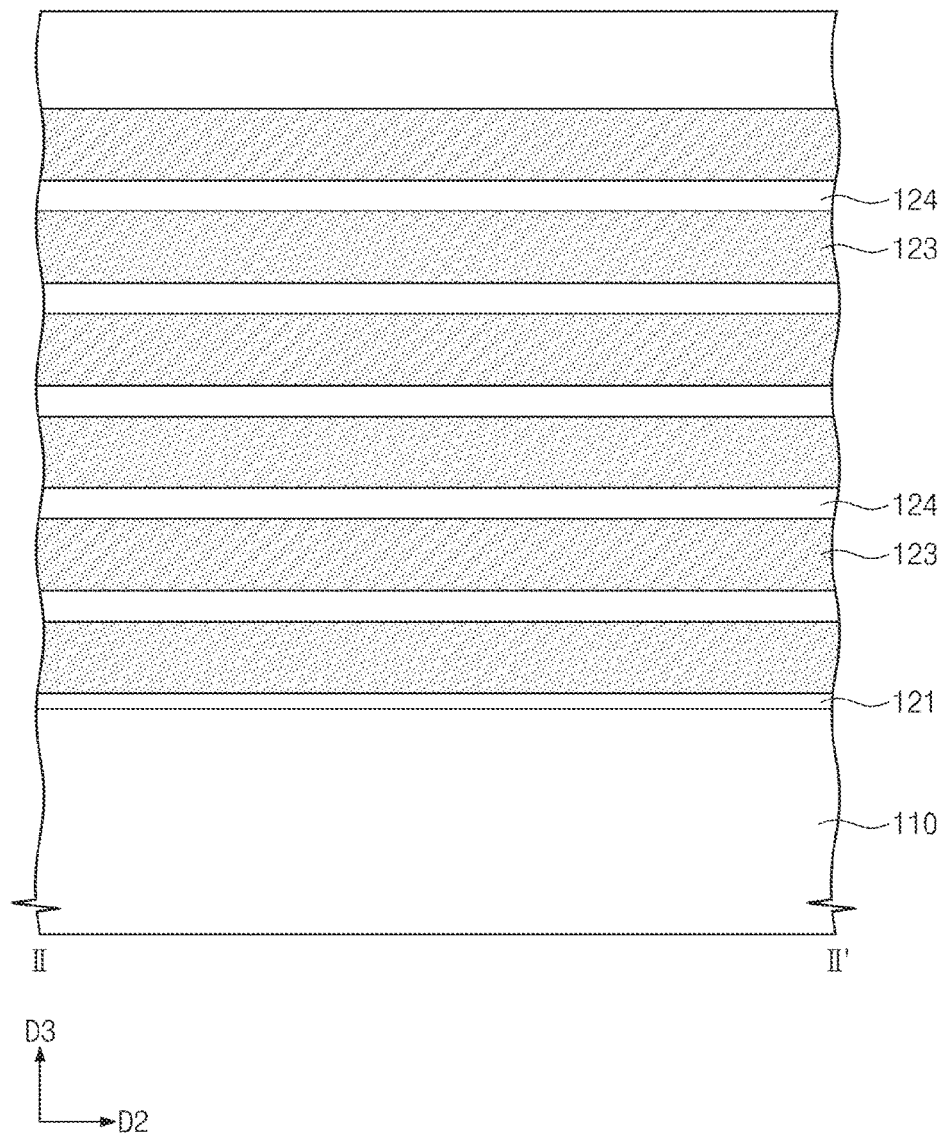
Figure 8A:
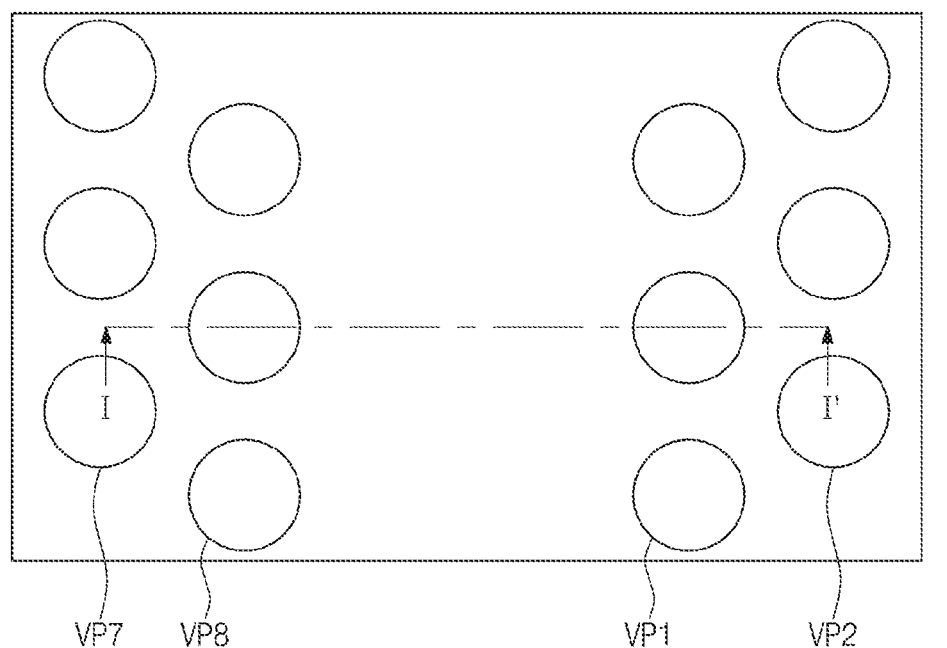
Figure 8B:
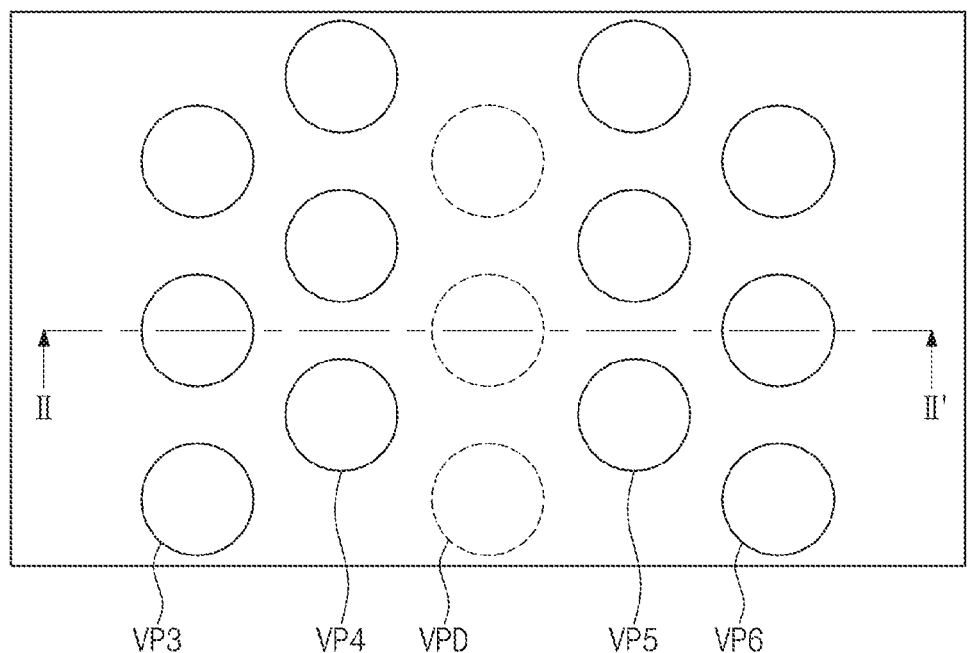
Figure 8B:
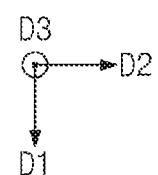
Figure 8C:
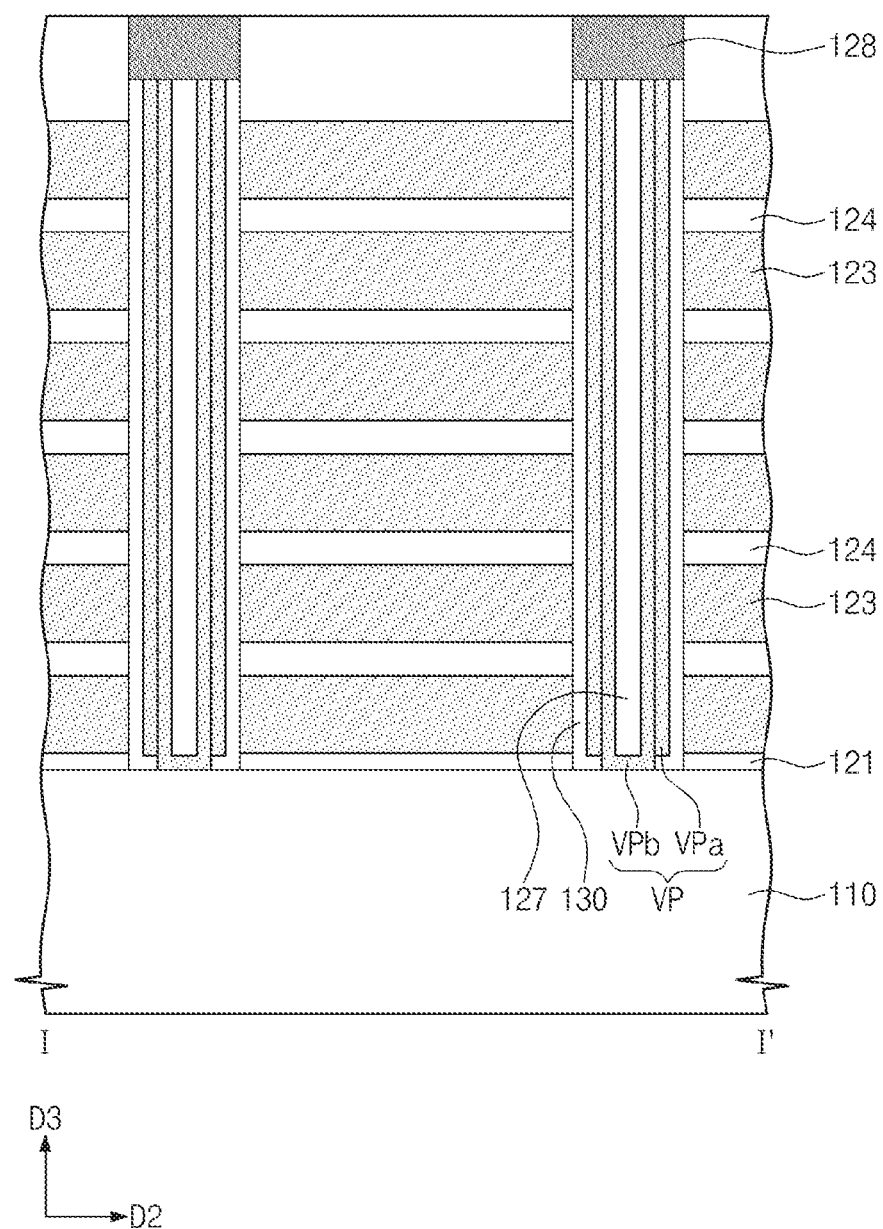
Figure 8D:
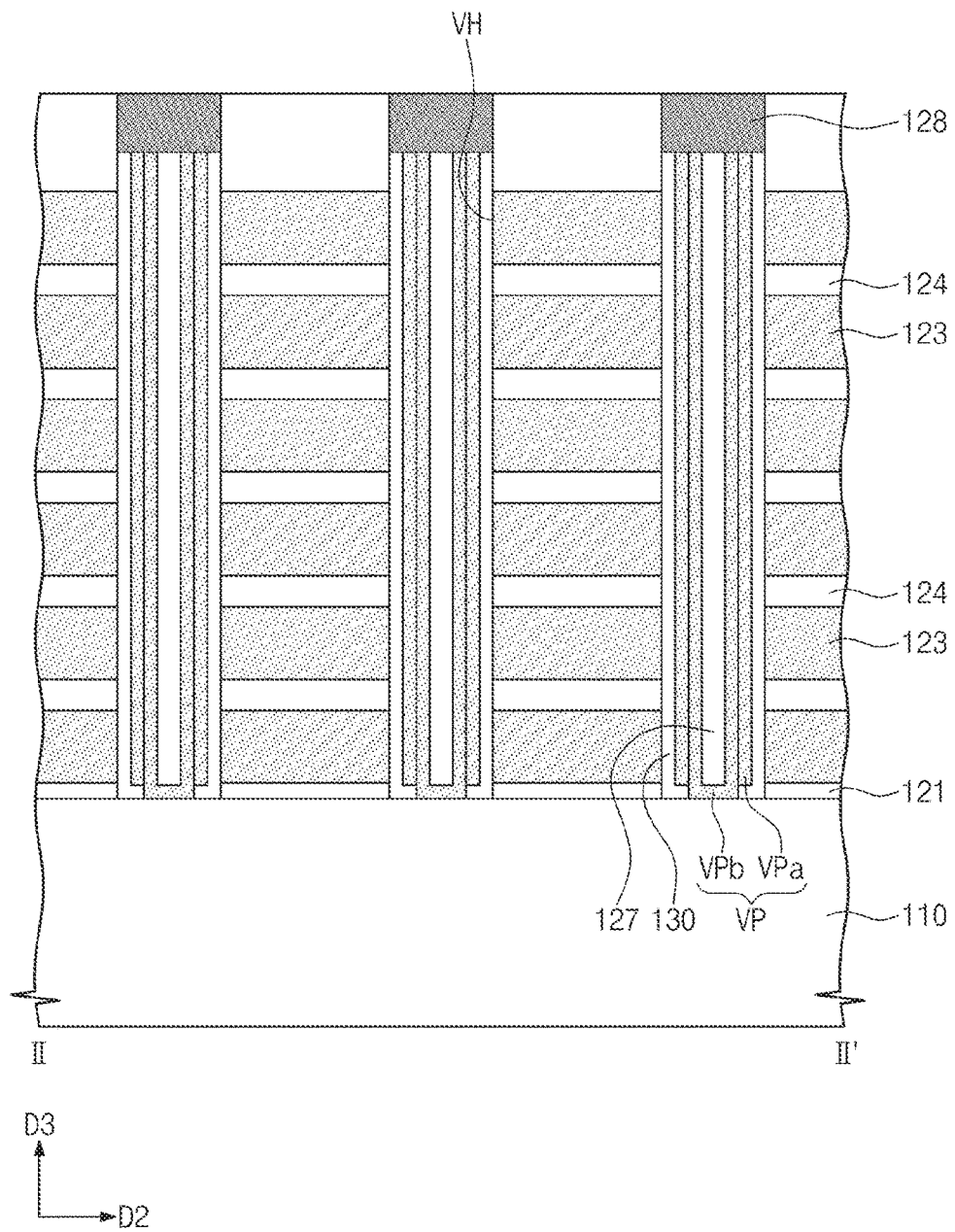
Figure 9A:
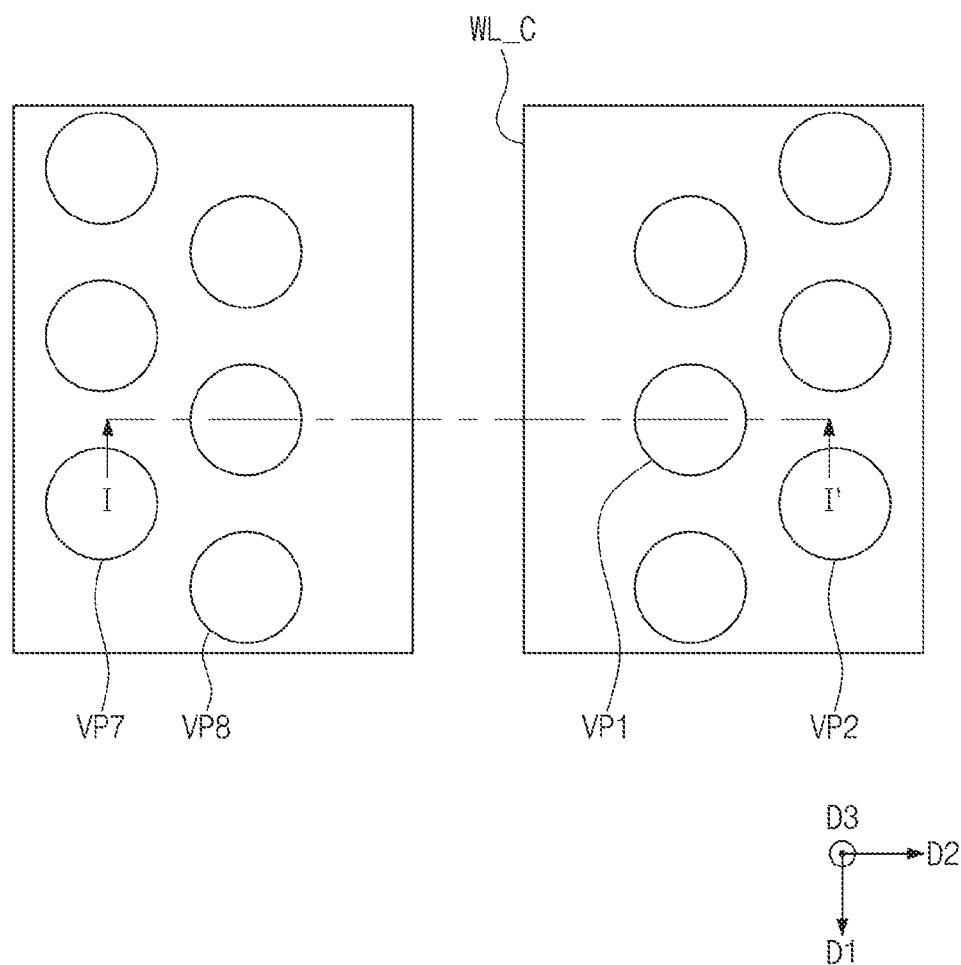
Figure 9B:
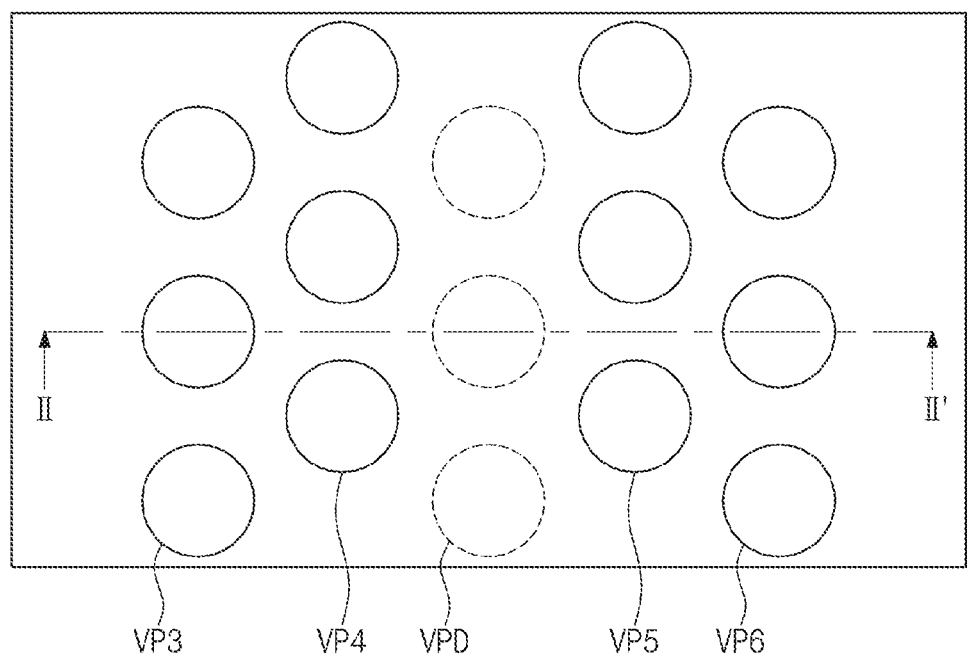
Figure 9C:
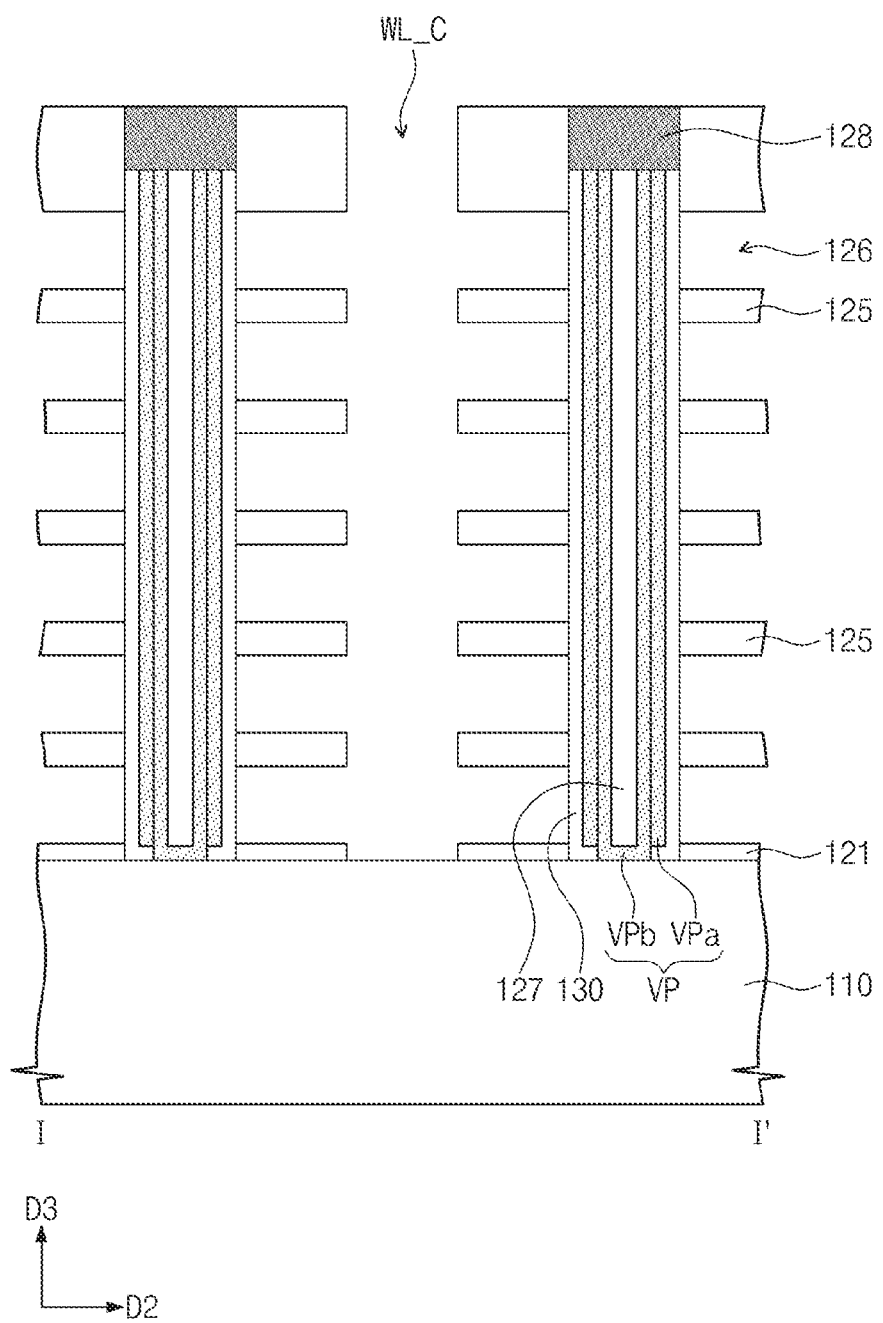
Figure 9D:
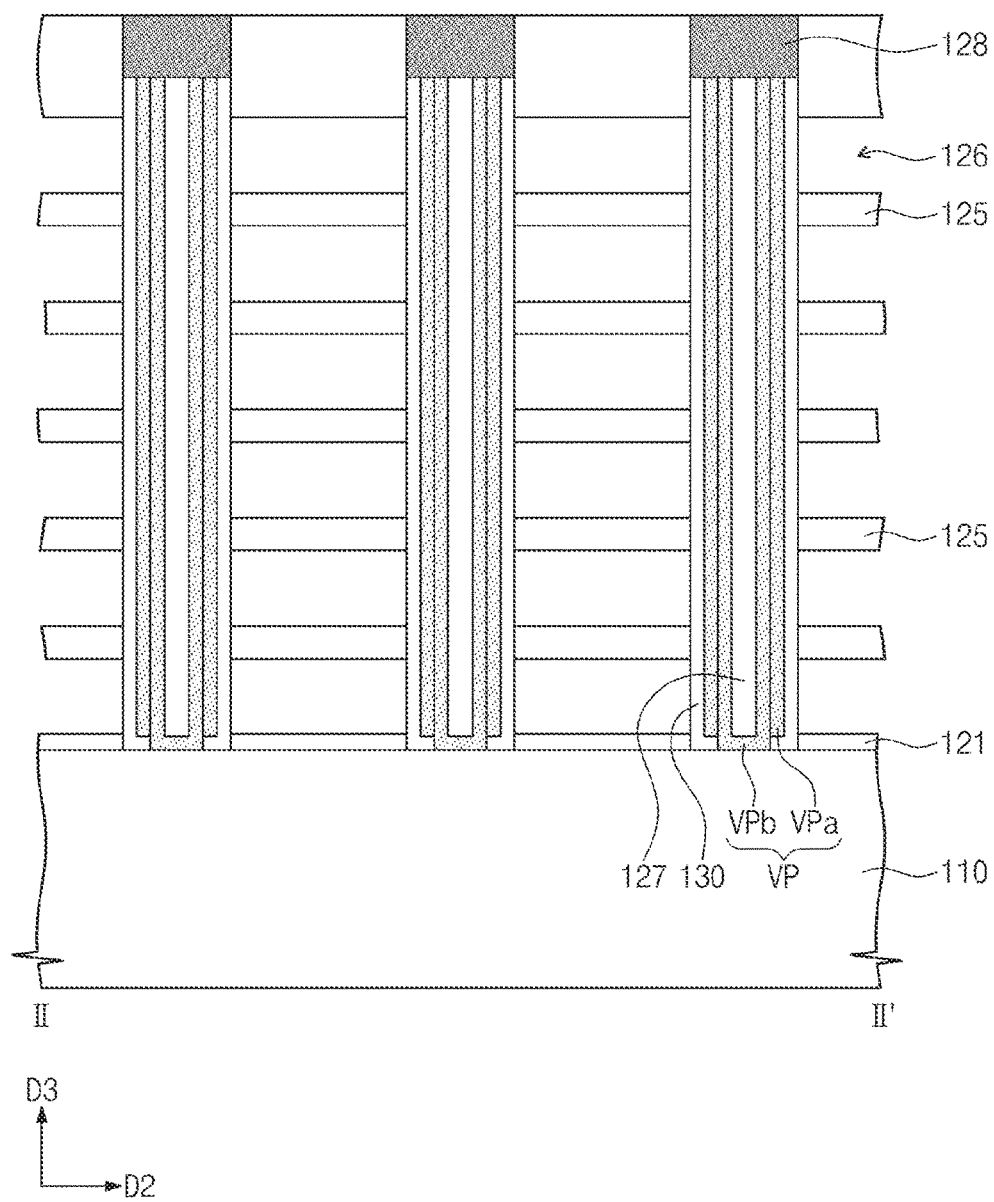
Figure 10A:
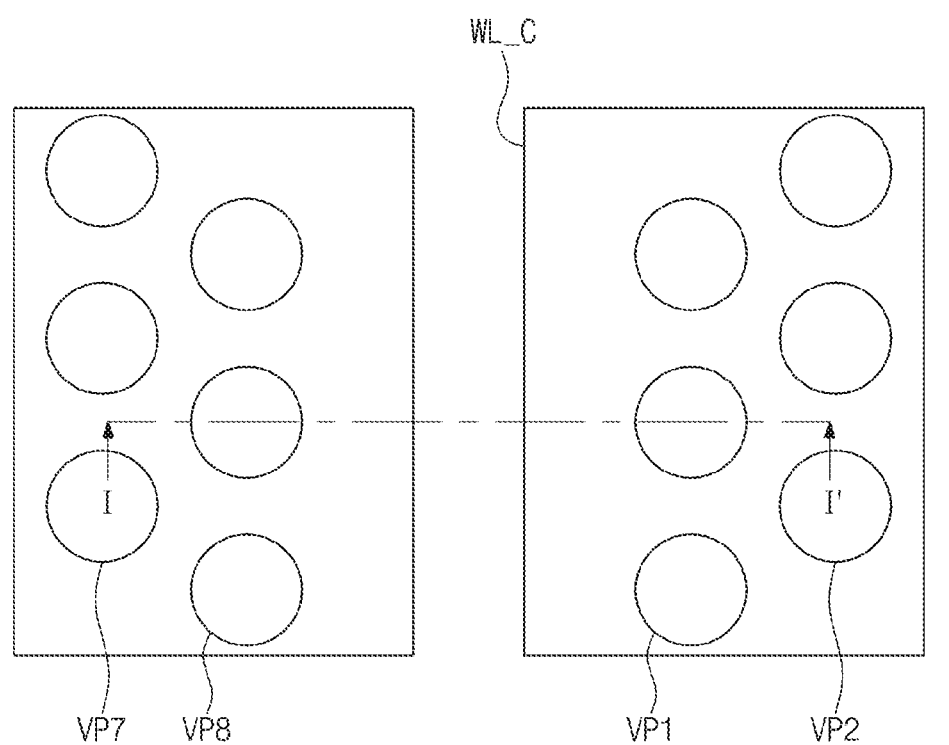
Figure 10A:
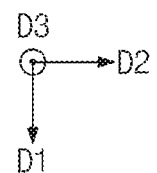
Figure 10B:
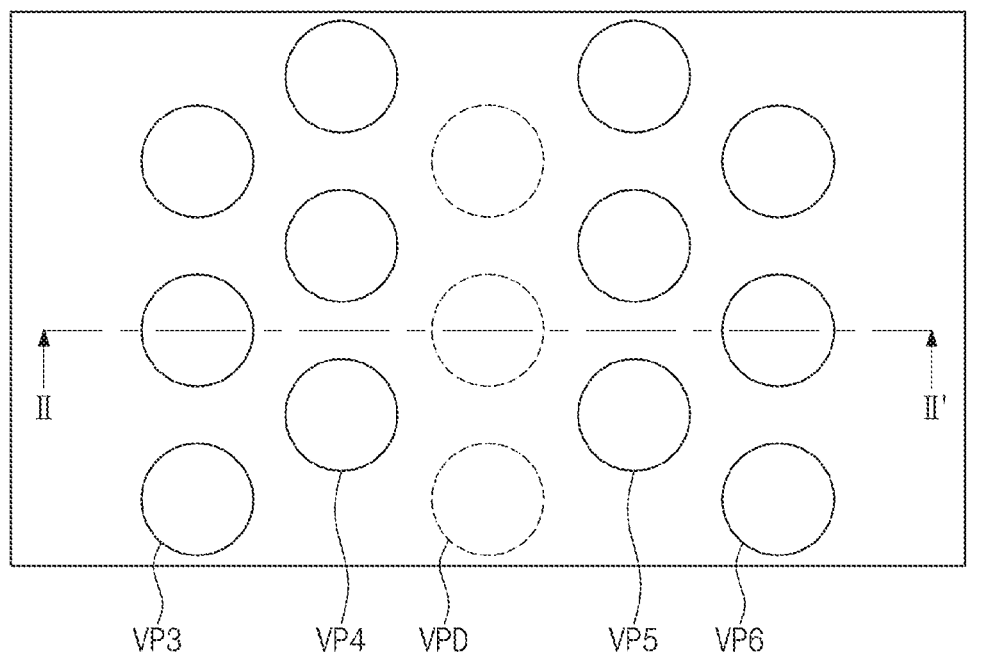
Figure 10C:
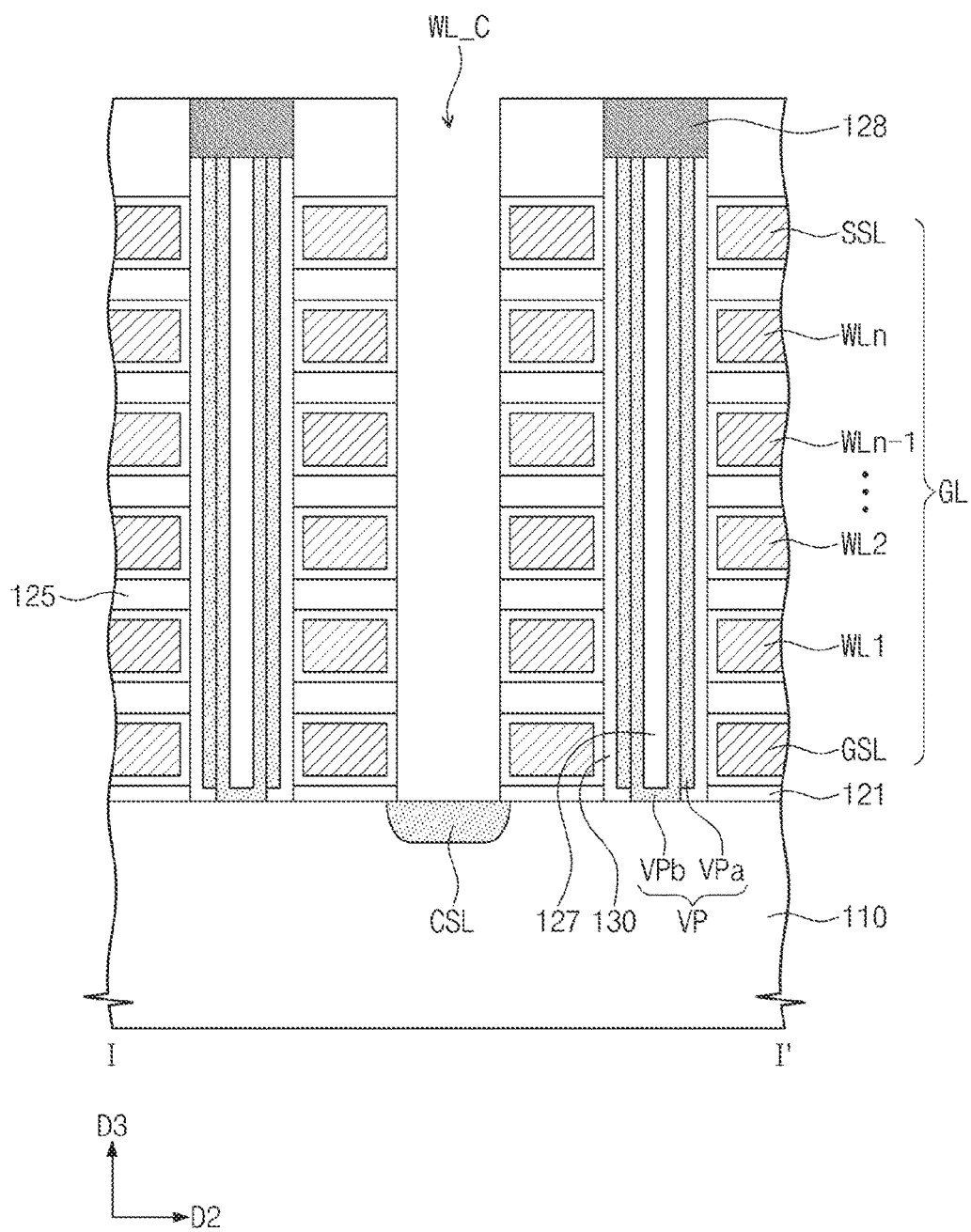
Figure 10D:
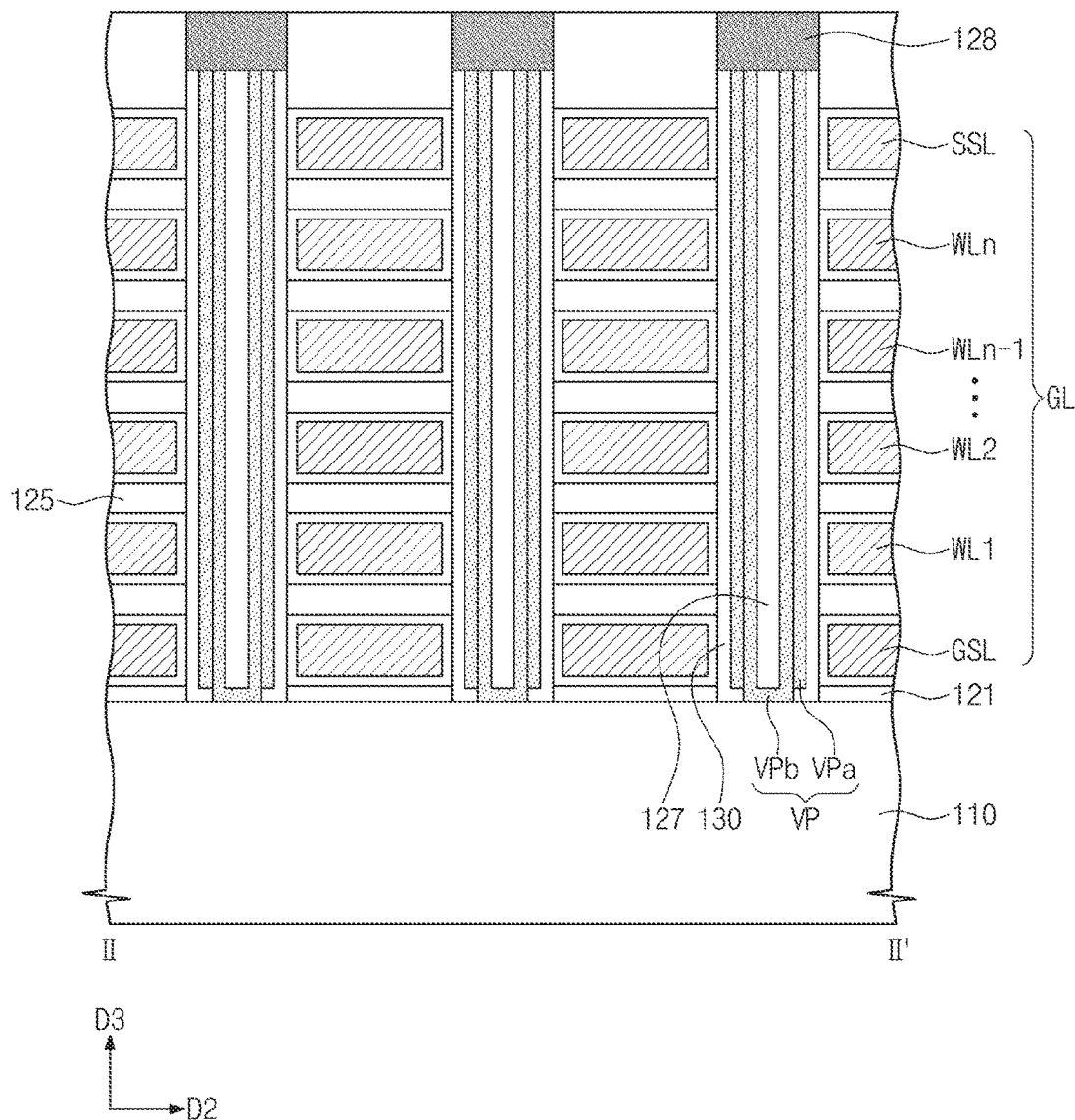

FIG. 6 is an enlarged view of a portion 'C' of FIG. 5A. Referring to FIGS. 5A and 6, data storing elements 130 may be provided between the gate electrodes GSL, WL1-WLn, and SSL and the vertical patterns VP.

In example embodiments, the data storing element 130 may include a tunnel insulating layer 133 adjacent to the vertical patterns VP, a blocking insulating layer 131 adjacent to the gate electrodes GSL, WL1-WLn, and SSL, and a charge storing layer 132 therebetween. The vertical patterns VP may be, for example, a semiconductor pillar. The tunnel insulating layer 133 may be formed of or include a silicon oxide layer. The charge storing layer 132 may be formed of or include a charge trap layer or an insulating layer with conductive nano particles. The charge trap layer may include, for example, a silicon nitride layer. The blocking insulating layer 131 may be formed of or include a high-k dielectric material, such as aluminum oxide or hafnium oxide. The blocking insulating layer 131 may be a multi-layered structure including a plurality of thin layers. For example, the blocking insulating layer 131 may be formed of or include an aluminum oxide layer and a silicon oxide layer, and a stacking sequence of the aluminum oxide layer and the silicon oxide layer may be variously modified. As an example, the blocking insulating layer 131 may include a first blocking insulating layer 131a and a second blocking insulating layer 131b. The first blocking insulating layer 131a may be formed of or include, for example, a silicon oxide layer, and the second blocking insulating layer 131b may be formed of or include, for example, an aluminum oxide layer or a hafnium oxide layer. The blocking insulating layer 131 may include at least a portion extending between the insulating patterns 125 and the gate electrodes GSL, WL1-WLn, and SSL. In example embodiments, the blocking insulating layer 131 may include at least a portion of extending between the insulating patterns 125 and the vertical patterns VP. For example, as shown in FIG. 6, the first blocking insulating layer 131a may include a portion extending between the insulating patterns 125 and the vertical patterns VP and the second blocking insulating layer 131b may include a portion extending between the insulating patterns 125 and the gate electrodes GSL, WL1-WLn, and SSL, but example embodiments of inventive concepts are not limited thereto.

In example embodiments, the data storing element 130 may be or include a variable resistance pattern. The variable resistance pattern may include at least one of variable resistance materials, whose resistance varies depending on an electric current passing therethrough. In this case, each of the vertical patterns VP may be or include a conductive pillar, which is formed of or contains at least one of conductive materials (e.g., doped semiconductor, metals, conductive metal nitrides, silicide materials, or nanostructures including carbon nanotube or graphene).

As an example, the data storing element 130 may include a material (e.g., a phase-changeable material) whose electric resistance can be changed using thermal energy applied thereto, and the thermal energy may be generated by an electric current passing through an electrode adjacent to the data storing element 130. The phase-changeable material may be a material including at least one of antimony (Sb), tellurium (Te), or selenium (Se). For example, the phase-changeable material may include a chalcogenide formed of tellurium (Te) having about 20 to about 80 atomic percent concentration, antimony (Sb) having about 5 to about 50 atomic percent concentration, and germanium (Ge) having the remaining concentration. Furthermore, the phase-changeable material may further include at least one of N, O, C, Bi, In, B, Sn, Si, Ti, Al, Ni, Fe, Dy, or La, which serves as an impurity. In example embodiments, the variable resistance pattern may be formed of one of GeBiTe, InSb, GeSb, and GaSb.

As an example, the data storing element 130 may be configured to have a layered structure whose electric resistance can be changed using an electric current passing therethrough (for example, by a spin transfer process). The data storing element 130 may be configured to have a layered structure exhibiting a magneto-resistance property and to include at least one ferromagnetic material and/or at least one antiferromagnetic material.

As an example, the data storing element 130 may include at least one of Perovskite compounds or transition metal oxides. For example, the data storing element 130 may include at least one of niobium oxide, titanium oxide, nickel oxide, zirconium oxide, vanadium oxide, PCMO ((Pr,Ca)MnO3), strontium-titanium oxide, barium-strontium-titanium oxide, strontium-zirconium oxide, barium-zirconium oxide, or barium-strontium-zirconium oxide.

Hereinafter, a method of forming a semiconductor memory device will be described with reference to FIGS. 7A through 11D. FIGS. 7A through 11A are plan views corresponding to FIG. 5A and FIGS. 7B through 11B are plan views corresponding to FIG. 5B. FIGS. 7C through 11C are sectional views taken along line I-I' of FIG. 7A and FIGS. 7D through 11D are sectional views taken along line II-II' of FIG. 7B.

Referring to FIGS. 7A through 7D, the substrate 110 may be provided. The substrate 110 may include a main surface that is parallel to both of the first and second directions D1 and D2. In example embodiments, the substrate 110 may have the first conductivity type (e.g., P-type). The buffer dielectric layer 121 may be formed on the substrate 110. The buffer dielectric layer 121 may be, for example, a silicon oxide layer. The buffer dielectric layer 121 may be formed by, for example, a thermal oxidation process. Sacrificial layers 123 and insulating layers 124 may be alternatingly stacked on the buffer dielectric layer 121. In example embodiments, the uppermost layer of the insulating layers 124 may be formed to have a thickness greater than the others of the insulating layers. The insulating layers 124 may be formed of or include, for example, a silicon oxide layer. The sacrificial layers 123 may include a material exhibiting a wet etching property different from those of the buffer dielectric layer 121 and the insulating layers 124. The sacrificial layers 123 may be formed of or include at least one of, for example, a silicon nitride layer, a silicon oxynitride layer, a poly-silicon layer, or a polycrystalline silicon-germanium layer. The sacrificial layers 123 and the insulating layers 124 may be formed using, for example, a chemical vapor deposition (CVD) method.

Referring to FIGS. 8A through 8D, vertical holes VH may be formed to penetrate the buffer dielectric layer 121, the sacrificial layers 123, and the insulating layers 124 and expose the substrate 110. The vertical holes VH may be formed to have substantially the same two-dimensional arrangement as that of the vertical patterns VP described with reference to FIGS. 5A and 5B.

The vertical patterns VP may be formed in the vertical holes VH, respectively. In example embodiments, the vertical patterns VP may be formed of or include a semiconductor layer (e.g., a silicon layer of a first conductivity type). Each of the vertical patterns VP may include the first semiconductor layer VPa and the second semiconductor layer VPb. For example, the first semiconductor layer VPa may be formed on sidewalls of the vertical holes VH to have a spacer-shaped structure, and the second semiconductor layer VPb may be formed on the first semiconductor layer VPa. For example, the first and second semiconductor layers VPa and VPb may be formed to partially or incompletely fill the vertical holes VH, and an insulating material may be formed on the semiconductor layers to fill the remaining spaces of the vertical holes VH. The semiconductor layers and the insulating material may be planarized to expose the uppermost layer of the insulating layers 124. As a result, the vertical patterns VP having a cylindrical structure may be formed in the vertical holes VH, respectively, and the inner space of each of the vertical patterns VP may be filled with the insulating gap-fill layer 127. Alternatively, the semiconductor layers may be formed to fill the vertical holes VH. In this case, the formation of the insulating gap-fill layer may be omitted. Upper portions of the vertical patterns VP may be recessed to have top surfaces that are lower than a top surface of the uppermost layer of the insulating layers 124. The conductive patterns 128 may be respectively formed in the recessed regions of the vertical holes VH. The conductive patterns 128 may be formed of a doped poly silicon layer or a metal layer. Drain regions may be formed by injecting impurities of second conductivity type into the conductive patterns 128 and upper portions of vertical patterns VP. In example embodiments, the second conductivity type may be n-type.

In example embodiments, the vertical patterns VP may include at least one of conductive materials, for example, doped semiconductors, metals, conductive metal nitrides, silicides, or nanostructures (such as carbon nanotube or graphene).

Before the formation of the vertical patterns VP, at least a portion of the data storing element 130 (e.g., the first blocking insulating layer 131a, the charge storing layer 132, and the tunnel insulating layer 133 of FIG. 6) may be formed. The data storing element 130 may be formed using one of deposition techniques with an excellent step-coverage property (e.g., using an atomic layer deposition and/or a chemical vapor deposition).

Referring to FIGS. 9A through 9D, the buffer dielectric layer 121, the sacrificial layers 123, and the insulating layers 124 may be successively patterned to form the first isolation regions WL_C exposing the substrate 110. The first isolation regions WL_C may be spaced apart from each other and extend parallel to the first direction D1. As a result of the patterning of the insulating layers 124, the insulating patterns 125 may be formed.

The sacrificial layers 123 exposed by the first isolation region WL_C may be selectively removed to from recess regions 126. As a result of the removal of the sacrificial layers 123, the recess regions 126 defined by the vertical patterns VP and the insulating patterns 125 may be formed. In the case where the sacrificial layers 123 include a silicon nitride layer or a silicon oxynitride layer, the removal of the sacrificial layers 123 may be performed using etching solution containing phosphoric acid. The recess regions 126 may be formed to partially expose the sidewalls of the vertical patterns VP.

Referring to FIGS. 10A through 10D, at least a portion of the data storing element 130 (e.g., the second blocking insulating layer 131b of FIG. 6) may be formed in the recess region 126.

A conductive layer may be formed on the data storing element 130 and in the recess region 126. The conductive layer may include at least one of a doped silicon layer, a metal layer (e.g., tungsten), a metal nitride layer, or a metal silicide layer. The conductive layer may be formed by, for example, an atomic layer deposition process. In the case where the conductive layer is a metal silicide layer, the formation of the conductive layer may include forming a poly-silicon layer, removing a portion of the poly-silicon layer adjacent to the first isolation region WL_C to form a recessed poly-silicon layer, forming a metal layer on the recessed poly-silicon layer, performing a thermal treatment process on the metal layer, and removing an unreacted portion of the metal layer. At least one of tungsten, titanium, cobalt, or nickel may be used as the metal layer for the metal silicide layer.

The conductive layer may be removed from a region (e.g., the first isolation region WL_C) positioned outside the recess regions 126. As a result, the conductive layer may remain in the recess regions 126 and thereby to form the gate electrodes GSL, WL1-WLn, and SSL, respectively. The gate electrodes GSL, WL1-WLn, and SSL may extend parallel to the first direction D1. Each of the electrode structures GL may include the gate electrodes GSL, WL1-WLn, and SSL. The electrode structures GL may be disposed spaced apart from each other in the second direction D2. Each electrode structure may be coupled with the vertical patterns VP, which are disposed in the first and second directions D1 and D2 to form a zigzag arrangement.

Since the conductive layer is removed from the first isolation region WL_C, a portion of the substrate 110 may be partially exposed by the first isolation region WL_C. The common source lines CSL may be formed by highly doping the exposed portion of the substrate 110 with impurity ions. For example, the common source lines CSL may be second conductivity type highly-doped regions formed in the substrate 110.

Figure 11A:
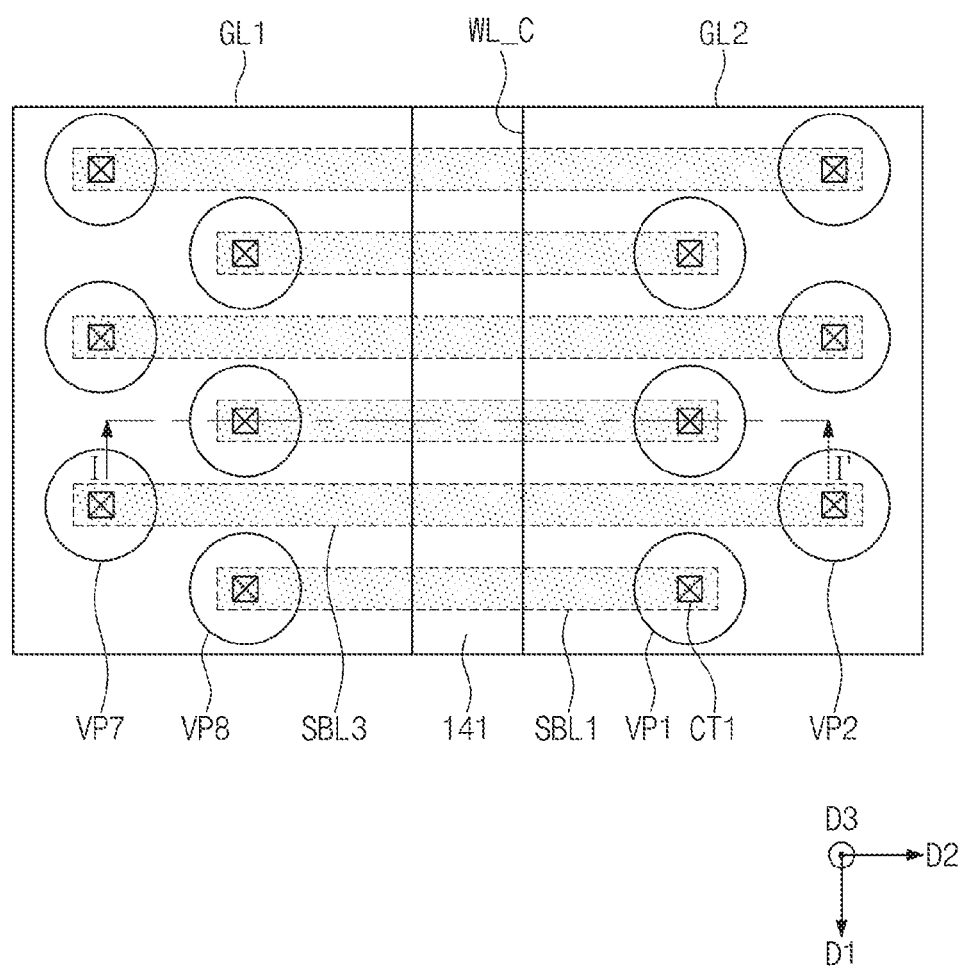
Figure 11B:
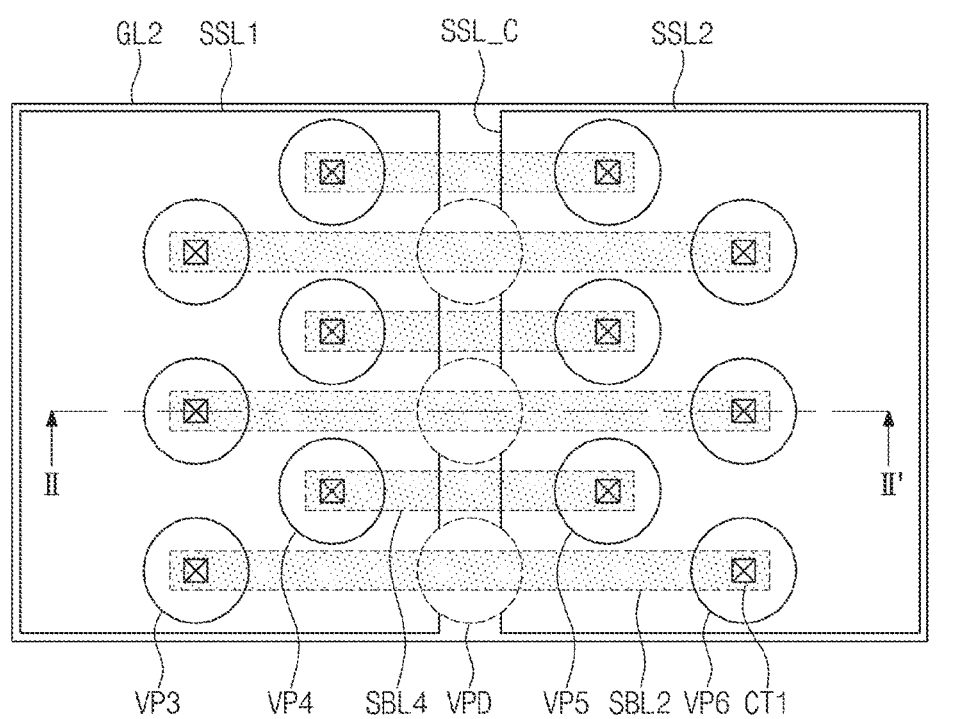
Figure 11C:
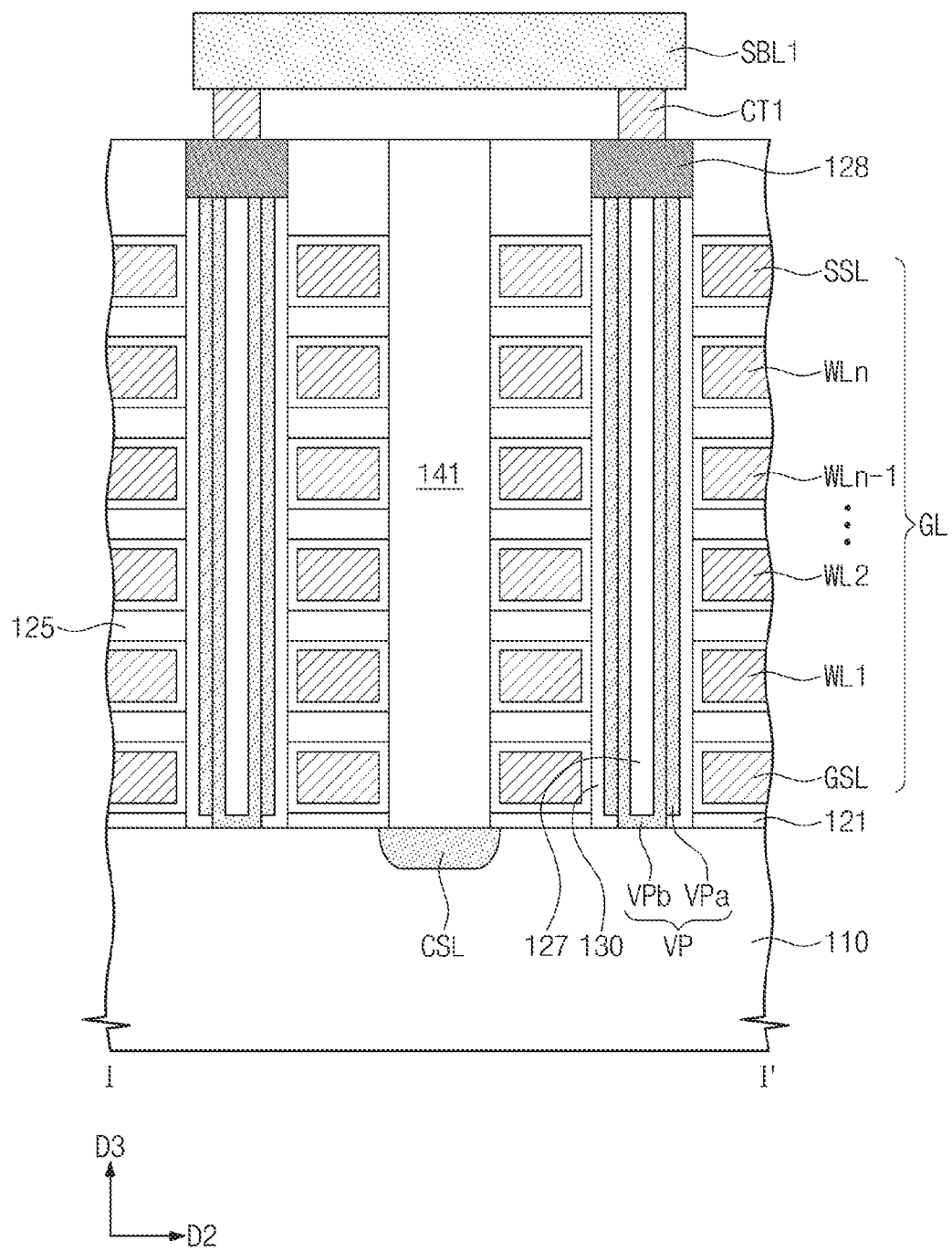
Figure 11D:
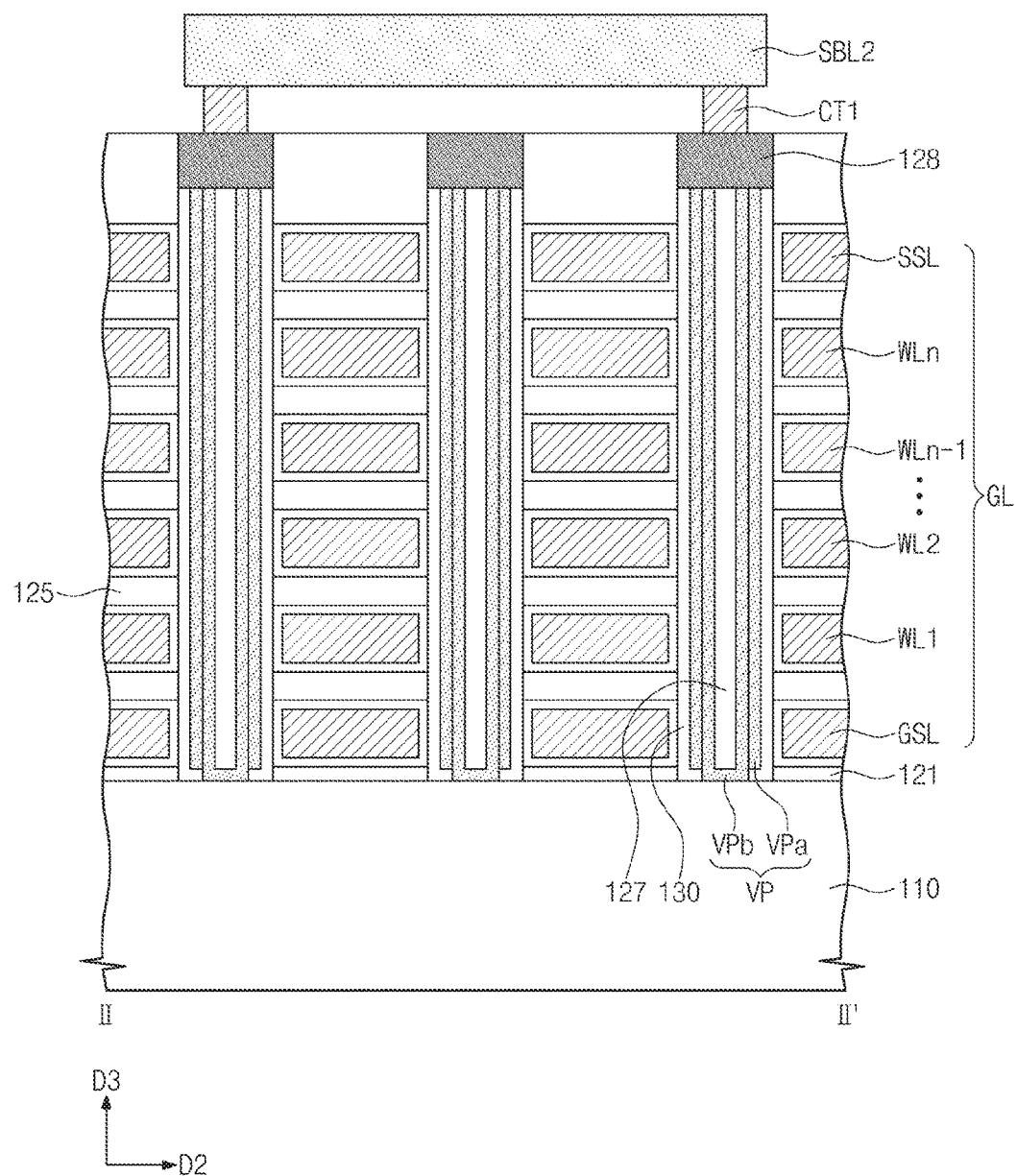

Referring to FIGS. 11A and 11B, the first isolation insulating layer 141 may be formed to fill the first isolation region WL_C. The string selection electrode SSL may be patterned in a direction parallel to the dummy vertical pattern VPD to form the first and second string selection electrodes SSL1 and SSL2. Thereafter, a second isolation insulating layer (not shown) may be formed to fill the second isolation region SSL_C between the first and second string selection electrodes SSL1 and SSL2.

The first contacts CT1 may be provided on the vertical patterns VP and may be connected to the conductive patterns 128. The subsidiary lines SBL may be formed on the first contact CT1s. The subsidiary lines SBL may be formed to have a bar-shaped structure extending parallel to the second direction D2. In example embodiments, the subsidiary lines SBL may be formed by a double patterning technology DPT method. In example embodiments, the subsidiary lines SBL may be disposed to have the arrangement shown in FIGS. 4A, 5A, and 5B. The subsidiary lines SBL may be connected to the vertical patterns VP, which are adjacent to each other in the second direction D2, through the first contacts CT1.

Referring back to FIGS. 5A through 5D, the subsidiary lines SBL may be connected to the bit lines BL through the second contacts CT2.

Figure 12A:
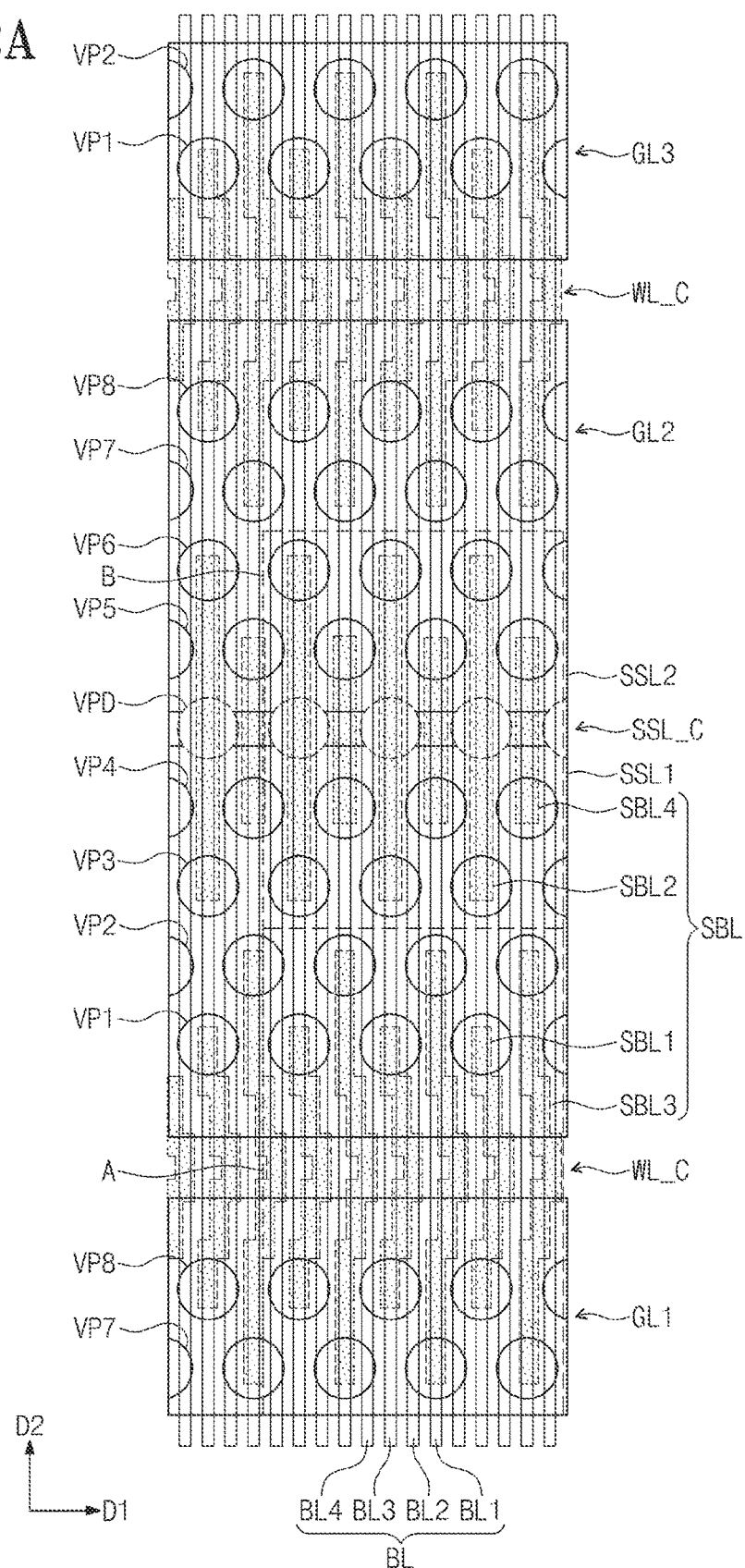
FIGS. 12A and 12B are plan views illustrating a semiconductor device according to example embodiments of inventive concepts.
Figure 12B:
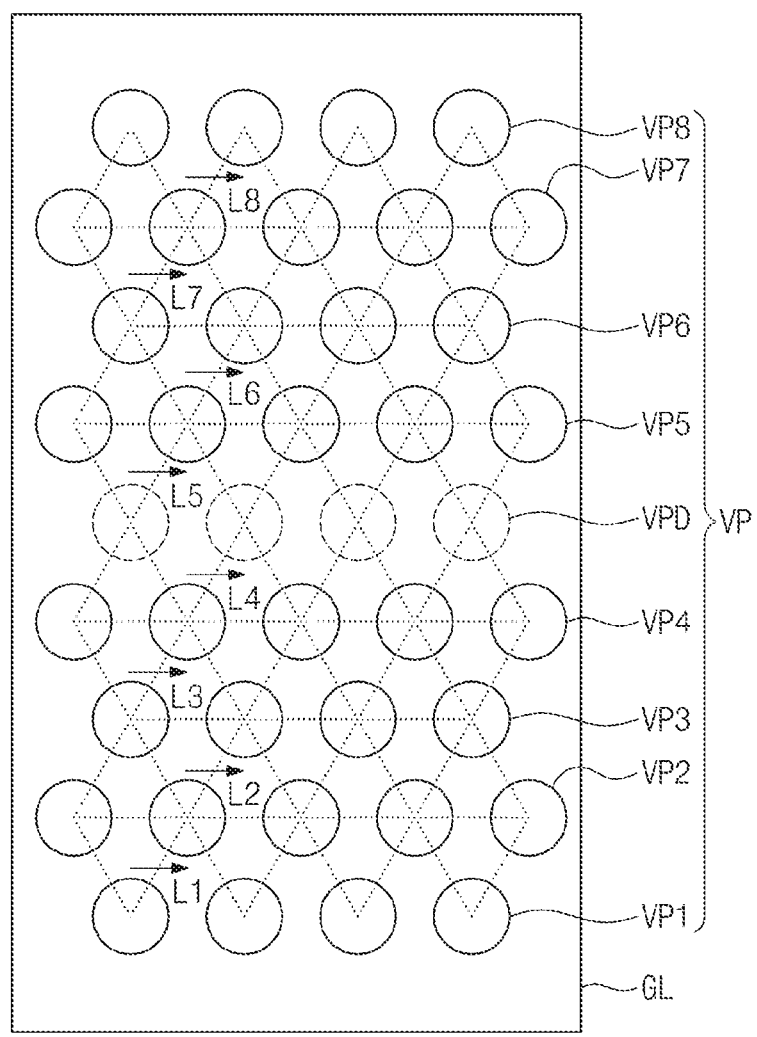
Figure 13A:
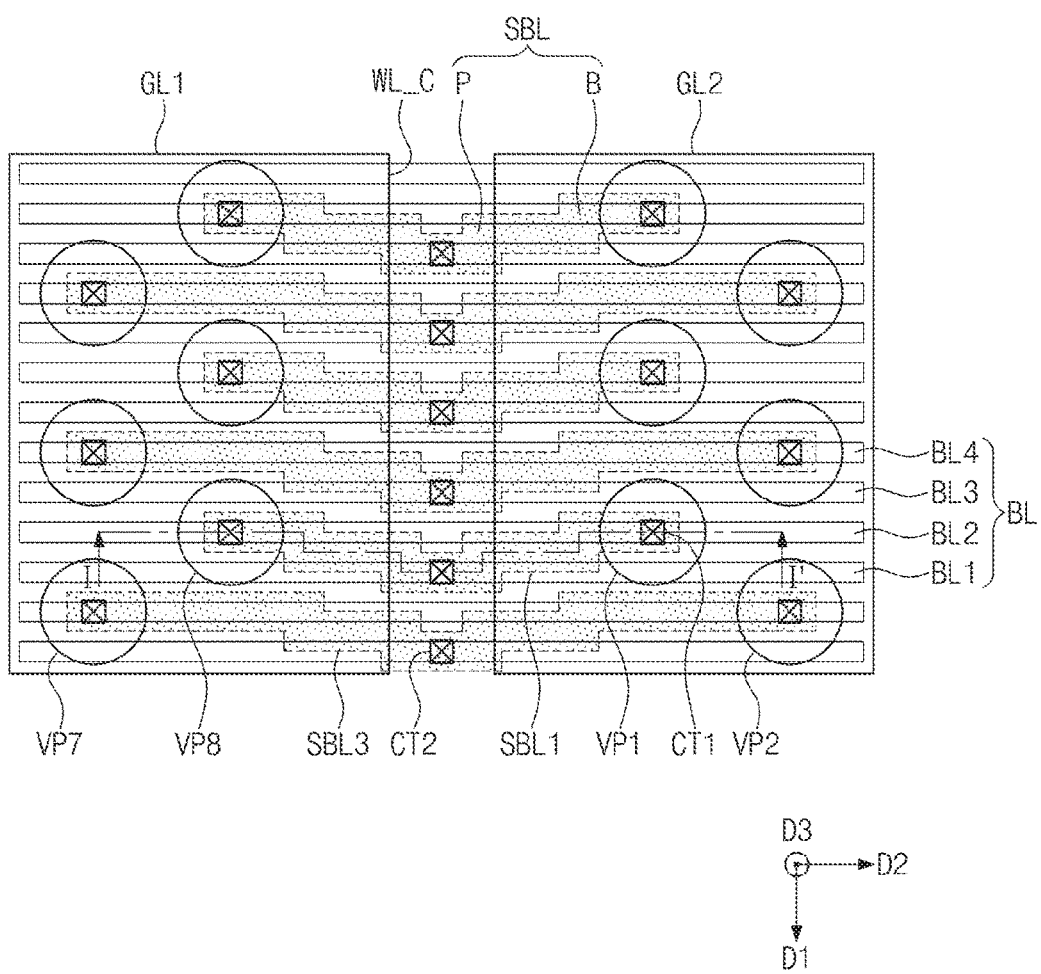
FIG. 13A is an enlarged view of a portion 'A' of FIG. 12A.
Figure 13B:
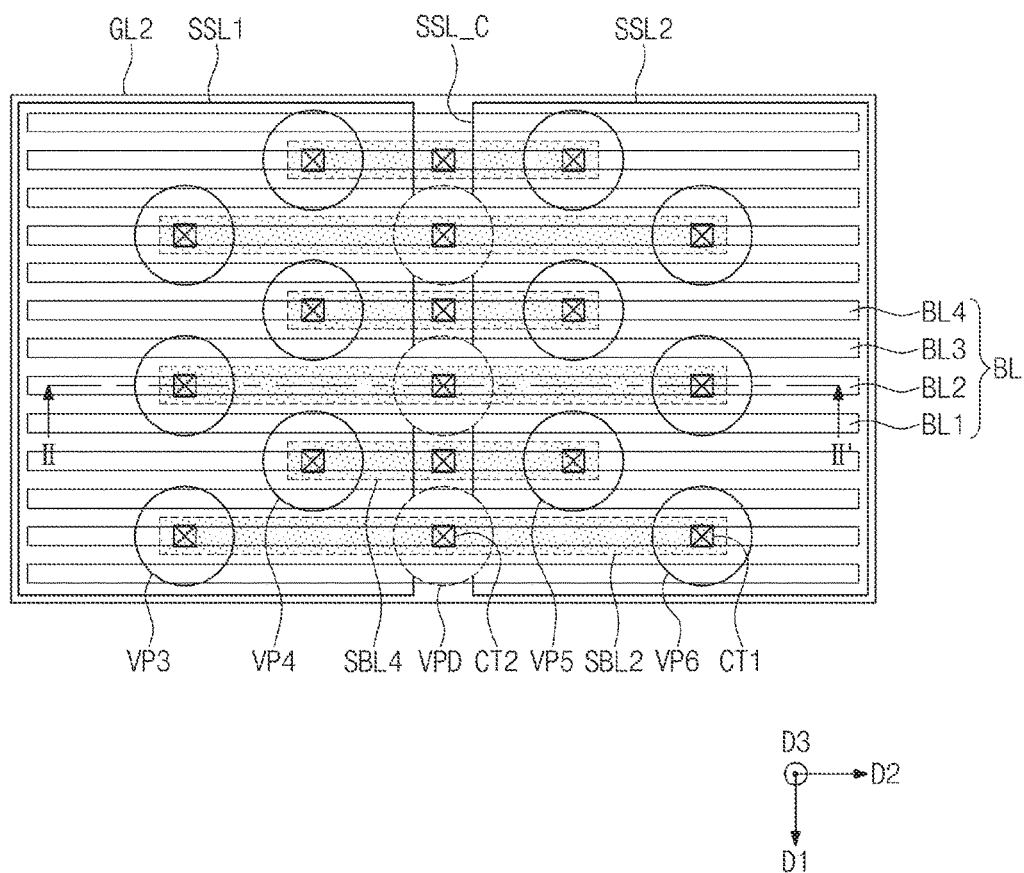
FIG. 13B is an enlarged view of a portion 'B' of FIG. 12A.
Figure 13C:
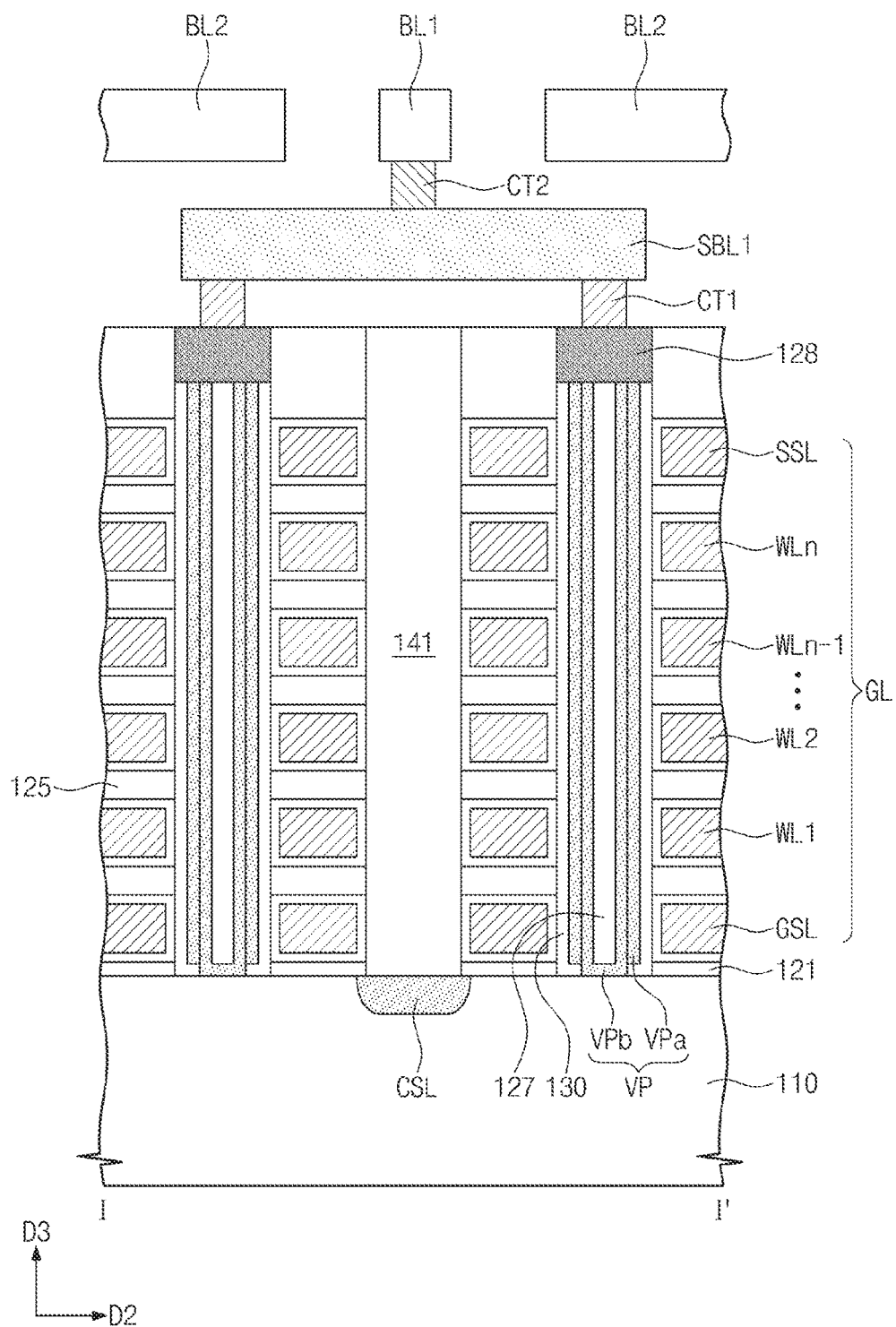
FIG. 13C is a sectional view taken along line I-I' of FIG. 13A.
Figure 13D:
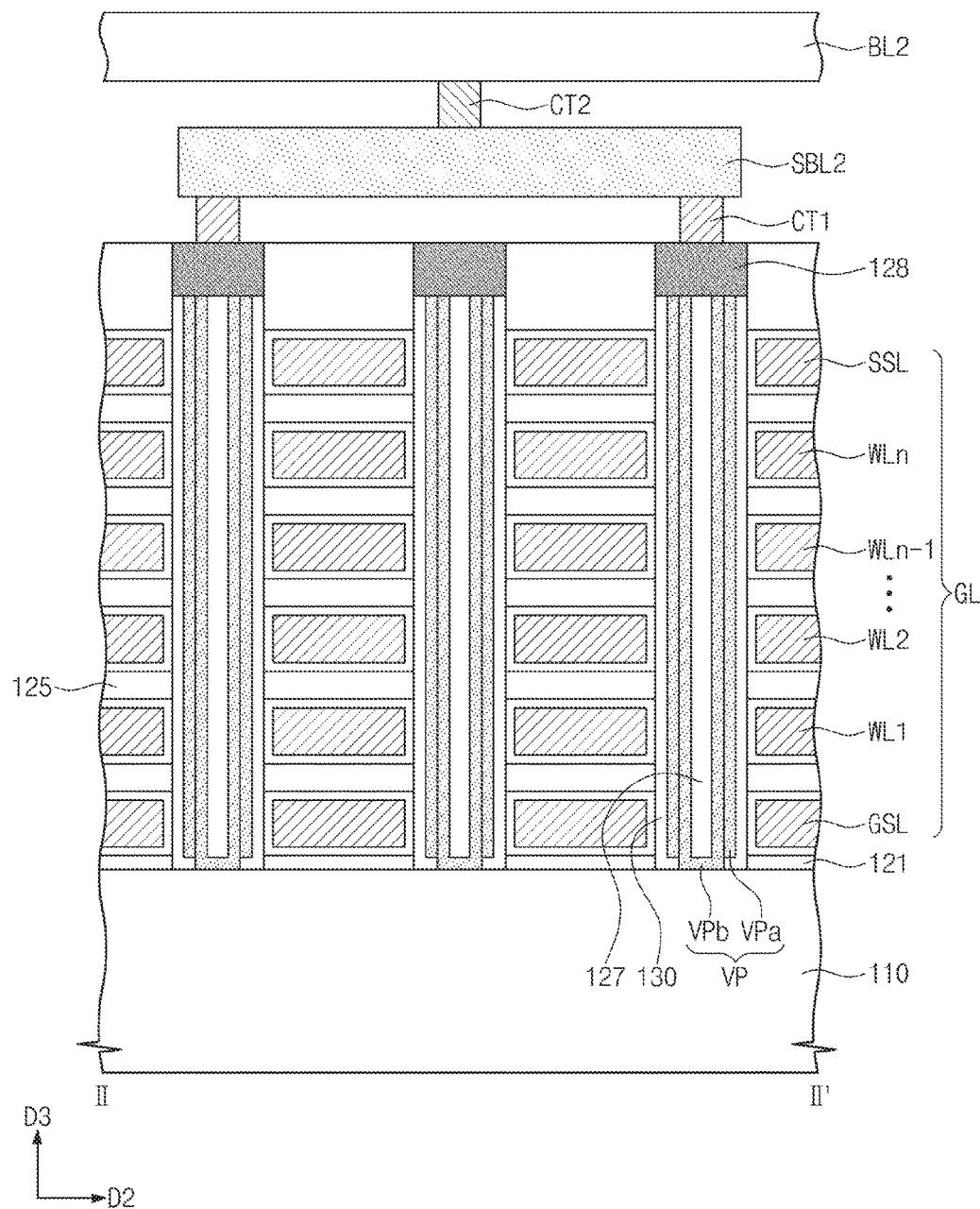
FIG. 13D is a sectional view taken along line II-II' of FIG. 13B.

FIGS. 12A and 12B are plan views illustrating a semiconductor device according to example embodiments of inventive concepts. In particular, FIG. 12B illustrates two-dimensional arrangement of the vertical patterns. FIG. 13A is an enlarged view of a portion 'A' of FIG. 12A and FIG. 13B is an enlarged view of a portion 'B' of FIG. 12A. FIG. 13C is a sectional view taken along line I-I' of FIG. 13A. FIG. 13D is a sectional view taken along line II-II' of FIG. 13B. For concise description, an element previously described with reference to FIGS. 5A and 5B may be identified by a similar or identical reference number without repeating an overlapping description thereof.

Referring to FIGS. 12A, 12B, and 13A through 13D, the vertical patterns VP may be provided to have substantially the same shift distance in the first direction D1. In other words, the first to eighth distances L1-L8 may be substantially the same. Accordingly, the vertical patterns VP may be disposed in such a way that centers of three most adjacent ones thereof are located at vertices of a regular triangle. In other words, the vertical patterns VP may be disposed in such a way that centers of four adjacent ones thereof are located at vertices of a rhombus.

In this case, each of the first and third subsidiary lines SBL1 and SBL3 may include a body B extending toward the second direction D2 and a protrusion P protruding toward the first direction D1. The protrusion P may be disposed on the first isolation region WL_C. Each of the second contacts CT2 connected to the first and third subsidiary lines SBL1 and SBL_3 may be in contact with the protrusion P.

The semiconductor device shown in FIGS. 12A and 12B may be fabricated using a method similar to that in the previous embodiments described with reference to FIGS. 5A and 5B. However, in example embodiments, not only the double patterning technology DPT method but also any other patterning method may be used to form the subsidiary lines SBL1-SBL4.

According to example embodiments of inventive concepts, a vertical-type memory device may be fabricated to have a reduced unit cell area and thereby to have an increased integration density. Accordingly, it is possible to increase the number of bit lines and a page size, compared with that of the conventional technology. This may make it possible to increase operation speed or performance of the memory device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While example embodiments of inventive concepts have been particularly shown and described it will be understood by one of ordinary skill in the art that variations in form and detail may be made therein without departing from the spirit and scope of the attached claims.

What is claimed is:

1. A semiconductor device, comprising:
    a substrate;
    an electrode structure on the substrate, the electrode structure including electrodes stacked on the substrate, the electrodes extending parallel to a first direction; and
    a plurality of vertical patterns passing through the electrode structure,
        the vertical patterns including first vertical patterns arranged in the first direction, second vertical patterns arranged in the first direction, and third vertical patterns arranged in the first direction,
        the second vertical patterns being adjacent to the first vertical patterns and spaced apart from the first vertical patterns in a second direction crossing the first direction,
        the third vertical patterns being adjacent to the second vertical patterns and spaced apart from the second vertical patterns in the second direction,
        the first and second vertical patterns being arranged so centers of three most adjacent vertical patterns among the first and second vertical patterns are positioned at vertices of a regular triangle, and
        the second and third vertical patterns being arranged so centers of three most adjacent vertical patters among the second and third vertical patterns are positioned at vertices of a scalene triangle;
    a plurality of bit lines connected to the plurality of vertical patterns; and
    a plurality of subsidiary lines between the plurality of vertical patterns and the plurality of bit lines in a third direction vertical to a top surface of the substrate, each of the plurality of subsidiary lines connecting a corresponding one of the plurality of bit lines to at least two of the plurality of vertical patterns that are spaced apart from each other in the second direction, wherein
    the vertical patterns further include fourth vertical patterns arranged in the first direction,
    the fourth vertical patterns are adjacent to the third vertical patterns,
    the fourth vertical patterns are spaced apart from the third vertical patterns in the second direction,
    the third and the fourth vertical patterns are arranged so centers of three most adjacent vertical patterns among the third and the fourth vertical patterns are positioned at vertices of a second regular triangle,
    the first vertical patterns are adjacent to an edge of the electrode structure,
    the vertical patterns further include dummy vertical patterns arranged in the first direction,
    the dummy vertical patterns are adjacent to the fourth vertical patterns,
    the dummy vertical patterns are spaced apart from the fourth vertical patterns in the second direction,
    the vertical patterns further include fifth vertical patterns, sixth vertical patterns, seventh vertical patterns, and eighth vertical patterns that are symmetrically arranged about the dummy vertical patterns with respect to the first vertical patterns, second vertical patterns, third vertical patterns, and fourth vertical patterns, respectively,
    the plurality of subsidiary lines include first subsidiary lines and second subsidiary lines,
    the first subsidiary lines connect the third vertical patterns to the sixth vertical patterns, respectively,
    the second subsidiary lines connect the fourth vertical patterns to the fifth vertical patterns, respectively, and
    the first subsidiary lines and the second subsidiary lines have a bar-shaped structure extending in the second direction.

2. The semiconductor device of claim 1, wherein the first subsidiary lines overlap the dummy vertical patterns, respectively, when viewed in a plan view.

3. The semiconductor device of claim 1, wherein the first subsidiary lines and the second subsidiary lines are alternatingly arranged in the first direction, and
    lengths of the first subsidiary lines in the second direction are different from lengths of the second subsidiary lines in the second direction.

4. The semiconductor device of claim 1, further comprising:
    an additional electrode structure spaced apart from the electrode structure in a direction opposite to the second direction, wherein
    the plurality of subsidiary lines include third subsidiary lines,
    the additional electrode structure includes substantially a same configuration as the electrode structure,
    the third subsidiary lines connect the eighth vertical patterns of the additional electrode structure to the first vertical patterns of the electrode structure, respectively, and
    the third subsidiary lines include a bar-shaped structure extending in the second direction.

5. The semiconductor device of claim 4, wherein
    the plurality of subsidiary lines include fourth subsidiary lines connecting seventh vertical patterns of the additional electrode structure to the second vertical patterns of the electrode structure, respectively, and
    the fourth subsidiary lines include a bar-shaped structure extending in the second direction.

6. The semiconductor device of claim 5, wherein
the plurality of bit lines include first, second, third, and fourth bit lines that are connected to the first, second, third, and fourth subsidiary lines, respectively, and
the first, second, third, and fourth bit lines extend in the second direction.

7. A semiconductor device, comprising:
a substrate;
an electrode structure on the substrate;
vertical patterns arranged in rows on the substrate,
   the vertical patterns extending through the electrode structure in a direction perpendicular to a top surface of the substrate,
   the vertical patterns in a same one of the rows being spaced apart from each other in a first direction,
   the vertical patterns including first vertical patterns in a first row, second vertical patterns in a second row, and third vertical patterns in a third row,
   the first to third rows of vertical patterns being arranged sequentially in a second direction from a same edge of the electrode structure such that the first to third vertical patterns all extend through a first half of the electrode structure along the second direction in a plan view,
   each center of two adjacent first vertical patterns being spaced apart from a center of an adjacent second vertical pattern by a diagonal distance that is the same as a distance in the first direction that the centers of the two adjacent first vertical patterns are spaced apart from each other,
   the vertical patterns including a dummy row of vertical patterns extending through the electrode structure, and
      the third vertical patterns being spaced apart in the second direction from corresponding dummy vertical patterns in the dummy row of vertical patterns;
a plurality of bit lines connected to the vertical patterns; and
a plurality of subsidiary lines between the vertical patterns and the plurality of bit lines in a third direction vertical to a top surface of the substrate, each of the plurality of subsidiary lines connecting a corresponding one of the plurality of bit lines to at least two of the plurality of vertical patterns that are spaced apart from each other in the second direction,
wherein the plurality of subsidiary lines include first subsidiary lines and second subsidiary lines which are alternatingly arranged in the first direction, and
lengths of the first subsidiary lines in the second direction are different from lengths of the second subsidiary lines in the second direction.

8. The semiconductor device of claim 7, wherein
the vertical patterns further include fourth vertical patterns in a fourth row, fifth vertical patterns in a fifth row, sixth vertical patterns in a sixth row, seventh vertical patterns in a seventh row, and eighth vertical patterns in an eighth row,
the fourth row of vertical patterns is between the dummy row of vertical patterns and the third row of vertical patterns,
the fifth to eighth rows of vertical patterns are arranged sequentially in the second direction from the dummy row of vertical patterns such that the fifth to eighth rows of vertical patterns all extend through a second half of the electrode structure along the second direction in the plan view.

9. The semiconductor device of claim 8, wherein
the fifth vertical patterns, sixth vertical patterns, seventh vertical patterns, and eighth vertical patterns are symmetrically arranged about the dummy vertical patterns with respect to the first vertical patterns, second vertical patterns, third vertical patterns, and fourth vertical patterns, respectively, and
each center of two adjacent third vertical patterns are spaced apart from a center of a nearby second vertical pattern by a diagonal distance that is different than a distance in the first direction that the centers of the two adjacent third vertical patterns are spaced apart from each other.

10. The semiconductor device of claim 8, wherein
the fifth vertical patterns, sixth vertical patterns, seventh vertical patterns, and eighth vertical patterns are symmetrically arranged about the dummy vertical patterns with respect to the first vertical patterns, second vertical patterns, third vertical patterns, and fourth vertical patterns, respectively, and
each center of two adjacent third vertical patterns are spaced apart from a center of a nearby second vertical pattern by a diagonal distance that is equal to a distance in the first direction that the centers of the two adjacent third vertical patterns are spaced apart from each other.

11. The semiconductor device of claim 8, further comprising:
another electrode structure spaced apart from the electrode structure in the second direction, wherein
the electrode structure is a first electrode structure and the other electrode structure is a second electrode structure,
the vertical patterns include additional vertical patterns that extend through the second electrode structure with the same arrangement as the vertical patterns that extend through the first electrode structure such that the vertical patterns include first to eighth vertical patterns and dummy vertical patterns extending through the second electrode structure,
the subsidiary lines further include third subsidiary lines, and fourth subsidiary lines,
the first subsidiary lines connect the third vertical patterns extending through the first electrode structure to corresponding sixth vertical patterns extending through the first electrode structure and spaced apart in the second direction,
the second subsidiary lines connect the fourth vertical patterns extending through the first electrode structure to corresponding fifth vertical patterns extending through the first electrode structure and spaced apart in the second direction,
the first and second subsidiary lines cross over the dummy vertical patterns,
the third subsidiary lines each connect one of the first vertical patterns extending through the first electrode structure to a corresponding one of the eighth vertical patterns extending through the second electrode structure and spaced apart in the second direction, and
the fourth subsidiary lines each connect one of the second vertical patterns extending though the first electrode structure to a corresponding one of the seventh vertical patterns extending through the second electrode structure and spaced apart in the second direction.

* * * * *